(12) United States Patent  (10) Patent No.: US 6,991,888 B2
Padmanaban et al.  (45) Date of Patent: Jan. 31, 2006

(54) PHOTORESIST COMPOSITION FOR DEEP ULTRAVIOLET LITHOGRAPHY COMPRISING A MIXTURE OF PHOTOACTIVE COMPOUNDS

(75) Inventors: Munirathna Padmanaban, Bridgewater, NJ (US); Takanori Kudo, Bedminster, NJ (US); Sangho Lee, Bridgewater, NJ (US); Ralph R. Dammel, Flemington, NJ (US); M. Dalil Rahman, Flemington, NJ (US)

(73) Assignee: AZ Electronic Materials USA Corp., Souerville, NJ (US)

( * ) Notice: Subject to any disclaimer, the term of this patent is extended or adjusted under 35 U.S.C. 154(b) by 159 days.

(21) Appl. No.: 10/439,472

(22) Filed: May 16, 2003

(65) Prior Publication Data

US 2003/0235782 A1   Dec. 25, 2003

Related U.S. Application Data

(63) Continuation-in-part of application No. 10/170,761, filed on Jun. 13, 2002, now abandoned.

(51) Int. Cl.
G03F 7/004   (2006.01)
C08F 2/46   (2006.01)
C07C 53/00   (2006.01)
G03C 5/00   (2006.01)

(52) U.S. Cl. ............... 430/270.1; 430/326; 430/914; 522/25; 554/85; 568/35

(58) Field of Classification Search ............ 430/270.1, 430/326, 521, 914; 522/31, 25; 568/18, 568/35; 554/85
See application file for complete search history.

(56) References Cited

U.S. PATENT DOCUMENTS

| 4,491,628 A | 1/1985 | Ito et al. .................. 430/176 |
| 5,021,197 A | 6/1991 | Takeda et al. |
| 5,320,931 A | 6/1994 | Umehara et al. |

FOREIGN PATENT DOCUMENTS

| EP | 0 502 382 A1 | 9/1992 |
| EP | 0 789 278 A2 | 8/1997 |
| EP | 97/33198 | 9/1997 |

OTHER PUBLICATIONS

Kevill, D.N. et al. J.Org.Chem. 59, 1994,6303-6312.*
G.A. Olah & E.G. Melby, J. Amer. Chem. Soc., 94(17), Aug. 23, 1972, pp 6620-1.

Primary Examiner—Rosemary Ashton
(74) Attorney, Agent, or Firm—Alan P. Kass

(57) ABSTRACT

The present invention relates to a novel photoresist composition that can be developed with an aqueous alkaline solution, and is capable of being imaged at exposure wavelengths in the deep ultraviolet. The invention also relates to a process for imaging the novel photoresist as well as novel photoacid generators.

The novel photoresist comprises a) a polymer containing an acid labile group, and b) a novel mixture of photoactive compounds, where the mixture comprises a lower absorbing compound selected from structure 1 and 2, and a higher absorbing compound selected from structure 4 and 5,

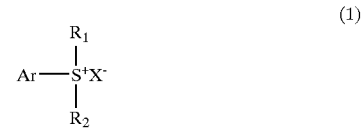
(1)

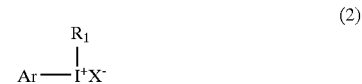

(2)

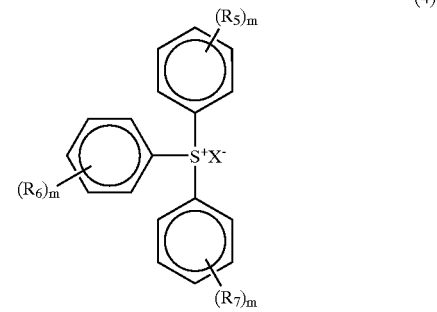

(4)

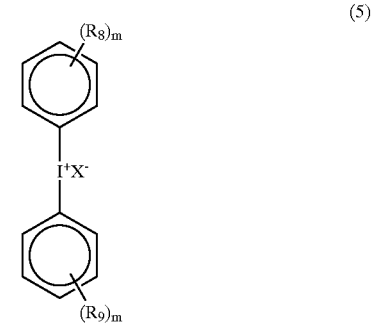

(5)

where, $R_1$ and $R_2$ $R_5$, $R_6$, $R_7$, $R_8$, and $R_9$ are defined herein; m=1–5; $X^-$ is an anion, and Ar is selected from naphthyl, anthracyl, and structure 3,

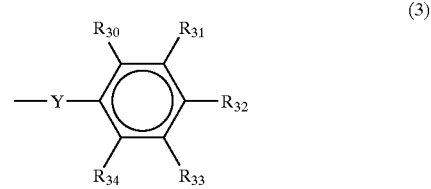
(3)

where $R_{30}$, $R_{31}$, $R_{32}$, $R_{33}$, and $R_{34}$ are defined herein.

19 Claims, No Drawings

U.S. PATENT DOCUMENTS

| | | | |
|---|---|---|---|
| 5,350,660 A | 9/1994 | Urano et al. ............... | 430/176 |
| 5,648,196 A | 7/1997 | Frechet et al. | |
| 5,843,624 A | 12/1998 | Houlihan et al. ........... | 430/296 |
| 5,879,857 A | 3/1999 | Chandross et al. ...... | 430/270.1 |
| 6,180,320 B1 * | 1/2001 | Saito et al. ................. | 430/311 |
| 6,187,504 B1 | 2/2001 | Suwa et al. .............. | 430/270.1 |
| 6,280,898 B1 | 8/2001 | Husegawa et al. | |
| 6,420,085 B1 | 7/2002 | Nishi et al. | |
| 6,479,210 B2 | 11/2002 | Kinoshita et al. | |
| 6,511,783 B1 | 1/2003 | Uenishi | |
| 6,517,994 B2 | 2/2003 | Watanabe | |
| 6,541,179 B2 | 4/2003 | Hatakeyama et al. | |
| 2003/0013039 A1 | 1/2003 | Kobayashi et al. | |

FOREIGN PATENT DOCUMENTS

| | | |
|---|---|---|
| EP | 0 877 293 A2 | 11/1998 |
| EP | 1 033 624 A1 | 9/2000 |
| EP | 1 041 442 A1 | 10/2000 |
| EP | 1 045 290 A2 | 10/2000 |
| EP | 1 085 377 A1 | 3/2001 |
| EP | 1 273 970 A2 | 1/2003 |
| EP | 1 179 750 A1 | 2/2003 |
| GB | 2 320 718 A | 7/1998 |
| GB | 2 332 679 A | 6/1999 |
| JP | 5-152718 * | 6/1993 |
| JP | 08-027094 | 1/1996 |
| JP | 10-48814 | 2/1998 |
| JP | 10-319581 | 4/1998 |
| JP | 100097075 * | 4/1998 |
| JP | 10-319581 | 12/1998 |
| WO | WO 00/17712 | 3/2000 |
| WO | WO 00/67072 | 11/2000 |

OTHER PUBLICATIONS

English language abstract and machine lamnguage translation of claims (from JPO) of JP 10-048814, Feb. 20, 1998.

English language abstract and machine language translation (from JPO) of JP 08-027094, Jan. 30, 1996.

English language copy of Notification of Transmittal of the International Preliminary Examination Report (Form PCT/IPEA/416) for PCT/EP03/06139.

English language copy of International Preliminary Examination Report (Form PCT/IPEA/409) for PCT/EP03/06139.

English language translation (from JPO) for JP 319581.

* cited by examiner

PHOTORESIST COMPOSITION FOR DEEP ULTRAVIOLET LITHOGRAPHY COMPRISING A MIXTURE OF PHOTOACTIVE COMPOUNDS

This application is a continuation-in-part of Ser. No. 10/170,761, filed Jun. 13, 2002 now abandoned, the contents of which are herein incorporated by reference.

FIELD OF INVENTION

The present invention relates to a novel photoresist composition that is particularly useful in the field of microlithography, and especially useful for imaging negative and positive patterns in the production of semiconductor devices. The photoresist composition comprises a copolymer and a photoactive component, where the photoactive component comprises a mixture of an aromatic onium salt and an alkyaryl onium salt. The novel photoresist composition provides both good photosensitivity and also significantly reduces edge roughness of the imaged photoresist profiles. Such a composition is especially useful for exposure at 193 nanometers (nm) and 157 nm. The invention further relates to a process for imaging the novel photoresist.

BACKGROUND OF THE INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist. The trend toward the miniaturization of semiconductor devices has led to the use of new photoresists that are sensitive at lower and lower wavelengths of radiation and has also led to the use of sophisticated multilevel systems to overcome difficulties associated with such miniaturization.

There are two types of photoresist compositions: negative-working and positive-working. The type of photoresist used at a particular point in lithographic processing is determined by the design of the semiconductor device. When negative-working photoresist compositions are exposed image-wise to radiation, the areas of the photoresist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Photoresist resolution is defined as the smallest feature, which the resist composition can transfer from the photomask to the substrate with a high degree of image edge acuity after exposure and development. In many leading edge manufacturing applications today, photoresist resolution on the order of less than one-half micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices. In cases where the photoresist dimensions have been reduced to below 150 nanometers (nm), the roughness of the photoresist patterns has become a critical issue. Edge roughness, commonly known as line edge roughness, is typically observed for line and space patterns as roughness along the photoresist line, and for contact holes as side wall roughness. Edge roughness can have adverse effects on the lithographic performance of the photoresist, especially in reducing the critical dimension latitude and also in transferring the line edge roughness of the photoresist to the substrate. Hence, photoresists that minimize edge roughness are highly desirable.

Photoresists sensitive to short wavelengths, between about 100 nm and about 300 nm are often used where subhalfmicron geometries are required. Particularly preferred are photoresists comprising non-aromatic polymers, a photoacid generator, optionally a dissolution inhibitor, and solvent.

High resolution, chemically amplified, deep ultraviolet (100–300 nm) positive and negative tone photoresists are available for patterning images with less than quarter micron geometries. To date, there are three major deep ultraviolet (UV) exposure technologies that have provided significant advancement in miniaturization, and these use lasers that emit radiation at 248 nm, 193 nm and 157 nm. Photoresists used in the deep UV typically comprise a polymer which has an acid labile group and which can deprotect in the presence of an acid, a photoactive component which generates an acid upon absorption of light, and a solvent.

Photoresists for 248 nm have typically been based on substituted polyhydroxystyrene and its copolymers, such as those described in U.S. Pat. Nos. 4,491,628 and 5,350,660. On the other hand, photoresists for 193 nm exposure require non-aromatic polymers, since aromatics are opaque at this wavelength. U.S. Pat. No. 5,843,624 and GB 2,320,718 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon:hydrogen ratios which improve etch resistance, they also provide transparency at low wavelengths and they have relatively high glass transition temperatures. Photoresists sensitive at 157 nm have been based on fluorinated polymers, which are known to be substantially transparent at that wavelength.

Photoresists derived from polymers containing fluorinated groups are described in WO 00/67072 and WO 00/17712.

The polymers used in a photoresist are designed to be transparent to the imaging wavelength, but on the other hand, the photoactive component has been typically designed to be absorbing at the imaging wavelength to maximize photosensitivity. The photosensitivity of the photoresist is dependent on the absorption characteristics of the photoactive component, the higher the absorption the less the energy required to generate the acid and the more photosensitive the photoresist is. Aromatic photoactive compounds, such as triphenyl sulfonium salts, diphenyl iodonium salts are known to give good photosensitivity at 248 nm, but have found to be too absorbing at wavelengths below 200 nm and lead to tapered photoresist profiles. Transparent sulfonium salts based on alkyl sulfonium salts have found to be too transparent at the imaging wavelength and result in poor photosensitivity. JP 10319581, EP 1,085,377, EP 1,041,442, and U.S. Pat. No. 6,187,504 disclose alkylaryl sulfonium salts of different structures that can be used in the photoresist composition.

The inventors of this application have found that the photoactive compounds known in the prior art cause unacceptable levels of line edge roughness, or if the line edge roughness is acceptable then the photosensitivity is poor. However, the inventors of this application have also found that if a mixture of alkylarylsulfonium or alkylaryliodonium salt and arylsulfonium or aryliodonium salt is used, the line edge roughness is significantly reduced while maintaining an acceptable level of photosensitivity. EP 1,085,377 discloses that mixtures of alkylarylsulfonium salts may be used with other onium salts, diazomethane derivatives, glyoxime derivatives and many other photoactive compounds. A mixture of photoactive compounds is not disclosed which when formulated into a photoresist would significantly reduce line edge roughness.

The present invention pertains to a novel photoresist composition comprising a polymer and a novel mixture of photosensitive compounds. The composition is particularly useful for imaging in the range of 100–300 nm, and more particularly for 157 nm and 193 nm.

SUMMARY OF THE INVENTION

The present invention relates to a novel photoresist composition useful for imaging in deep UV comprising a) a polymer containing an acid labile group, and, b) a novel mixture of photoactive compounds, where the mixture comprises a lower absorbing compound selected from structure (1) and (2), and a higher absorbing compound selected from structure (4) and (5),

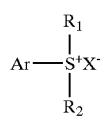

(1)

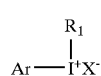

(2)

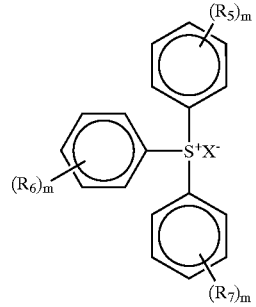

(4)

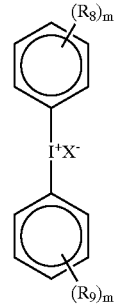

(5)

where $R_1$ and $R_2$ are independently $C_{1-20}$ straight or branched alkyl chain optionally containing one or more O atoms, $C_{5-50}$ aralkyl or $C_{5-50}$ monocyclic, bicyclic, or tricylic alkyl group; each of $R_5$, $R_6$, $R_7$, $R_8$, and $R_9$ are independently hydrogen, hydroxyl, $C_{1-20}$ straight or branched alkyl chain optionally containing one or more O atoms, $C_{5-50}$ aralkyl or $C_{5-50}$ monocyclic, bicyclic, or tricylic alkyl group; m=1–5; $X^-$ is an anion; and Ar is selected from naphthyl, anthryl, and structure (3),

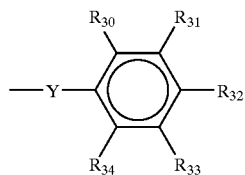

(3)

where each of $R_{30}$, $R_{31}$, $R_{32}$, $R_{33}$, and $R_{34}$ are independently selected from hydrogen, hydroxyl, $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, $C_{5-50}$ aryl group, $C_{5-50}$ arylcarbonylmethylene group, phenyl group, naphthyl group, anthryl group, peryl group, pyryl group, thienyl group, $C_{5-50}$ aralkyl group, —O—$C_{5-50}$ monocyclic, bicyclic, or tricylic alkyl group, —O—$C_{5-50}$ aryl group, —O—$C_{5-50}$ aralkyl group, —O—$C_{5-50}$ arylcarbonylmethylene group, or —O—C(=O)—O—$R_{18}$ where $R_{18}$ is $C_{1-20}$ straight or branched alkyl chain optionally containing one or more O atoms, $C_{5-50}$ monocyclic, bicyclic, or tricylic alkyl group, $C_{5-50}$ aryl, or $C_{5-50}$ aralkyl group; the $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, phenyl group, naphthyl group, anthryl group, peryl group, pyryl group, thienyl group, $C_{5-50}$ aralkyl group, $C_{5-50}$ aryl group, or $C_{5-50}$ arylcarbonylmethylene group being unsubstituted or substituted by one or more groups selected from the group consisting of halogen, $C_{1-10}$ alkyl, $C_{3-20}$ cyclic alkyl, $C_{1-10}$ alkoxy, $C_{3-20}$ cyclic alkoxy, di $C_{1-10}$ alkylamino, dicyclic di $C_{1-10}$ alkylamino, hydroxyl, cyano, nitro, oxo, aryl, aralkyl, oxygen, aryloxy, arylthio, and groups of formulae (II) to (VI):

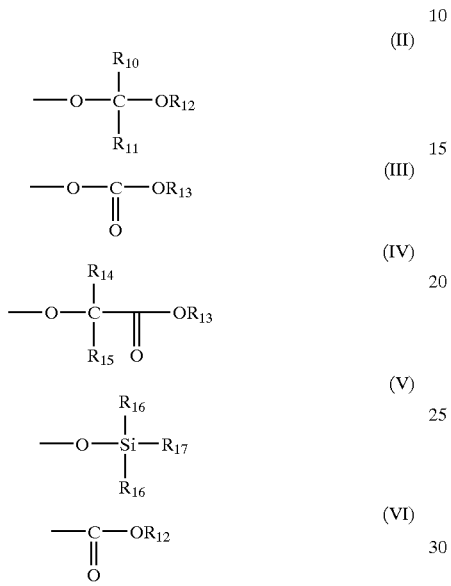

wherein $R_{10}$ and $R_{11}$ each independently represent a hydrogen atom, a $C_{1-20}$ straight or branched alkyl chain optionally containing one or more O atoms, or a $C_{5-50}$ monocyclic, bicyclic, or tricylic alkyl group, or $R_{10}$ and $R_{11}$ together can represent an alkylene group to form a five- or six-membered ring, $R_{12}$ represents a $C_{1-20}$ straight or branched alkyl chain optionally containing one or more O atoms, a $C_{5-50}$ monocyclic, bicyclic, or tricylic alkyl group, or a $C_{5-50}$ aralkyl group, or $R_{10}$ and $R_{12}$ together represent an alkylene group which forms a five- or six-membered ring together with the interposing —C—O— group, the carbon atom in the ring being optionally substituted by an oxygen atom, $R_{13}$ represents a $C_{1-20}$ straight or branched alkyl chain optionally containing one or more O atoms or a $C_{5-50}$ monocyclic, bicyclic, or tricylic alkyl group, $R_{14}$ and $R_{15}$ each independently represent a hydrogen atom, a $C_{1-20}$ straight or branched alkyl chain optionally containing one or more O atoms or a $C_{5-50}$ monocyclic, bicyclic, or tricylic alkyl group, $R_{16}$ represents a $C_{1-20}$ straight or branched alkyl chain optionally containing one or more O atoms, a $C_{5-50}$ monocyclic, bicyclic, or tricylic alkyl group, a $C_{5-50}$ aryl group, or a $C_{5-50}$ aralkyl group, and $R_{17}$ represents $C_{1-20}$ straight or branched alkyl chain optionally containing one or more O atoms, a $C_{5-50}$ monocyclic, bicyclic, or tricylic alkyl group, a $C_{5-50}$ aryl group, a $C_{5-50}$ aralkyl group, the group —Si(R$_{16}$)$_2$R$_{17}$, or the group —O—Si(R$_{16}$)$_2$R$_{17}$; and Y is a single bond or $(C_1–C_6)$alkyl.

The invention also relates to a process for imaging a photoresist comprising the steps of a) coating a substrate with the novel photoresist composition, b) baking the substrate to substantially remove the solvent, c) image-wise exposing the photoresist coating, d) postexposure baking the photoresist coating, and e) developing the photoresist coating with an aqueous alkaline solution.

The invention also relates to novel compounds useful in the above compositions and processes. The compounds are selected from

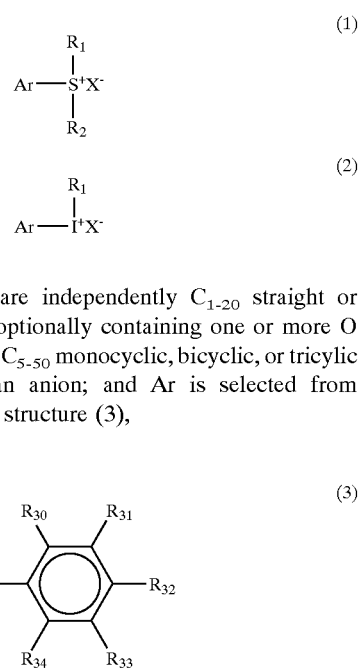

where $R_1$ and $R_2$ are independently $C_{1-20}$ straight or branched alkyl chain optionally containing one or more O atoms, $C_{5-50}$ aralkyl or $C_{5-50}$ monocyclic, bicyclic, or tricylic alkyl group; X$^-$ is an anion; and Ar is selected from naphthyl, anthryl, and structure (3), where each of $R_{30}$, $R_{31}$, $R_{32}$, $R_{33}$, and $R_{34}$ are independently selected from hydrogen, hydroxyl, $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, $C_{5-50}$ aryl group, $C_{5-50}$ arylcarbonylmethylene group, phenyl group, naphthyl group, anthryl group, peryl group, pyryl group, thienyl group, $C_{5-50}$ aralkyl group, —O—$C_{5-50}$ monocyclic, bicyclic, or tricylic alkyl group, —O—$C_{5-50}$ aryl group, —O—$C_{5-50}$ aralkyl group, —O—$C_{5-50}$ arylcarbonylmethylene group, or —O—C(=O)—O—R$_{18}$ where $R_{18}$ is $C_{1-20}$ straight or branched alkyl chain optionally containing one or more O atoms, $C_{5-50}$ monocyclic, bicyclic, or tricylic alkyl group, $C_{5-50}$ aryl, or $C_{5-50}$ aralkyl group;

the $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, phenyl group, naphthyl group, anthryl group, peryl group, pyryl group, thienyl group, $C_{5-50}$ aralkyl group, $C_{5-50}$ aryl group, or $C_{5-50}$ arylcarbonylmethylene group being unsubstituted or substituted by one or more groups selected from the group consisting of halogen, $C_{1-10}$ alkyl, $C_{3-20}$ cyclic alkyl, $C_{1-10}$ alkoxy, $C_{3-20}$ cyclic alkoxy, di $C_{1-10}$ alkylamino, dicyclic di $C_{1-10}$ alkylamino, hydroxyl, cyano, nitro, oxo, aryl, aralkyl, oxygen, aryloxy, arylthio, and groups of formulae (II) to (VI):

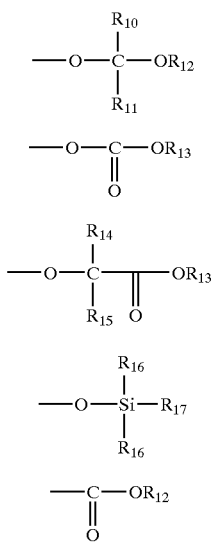

(II)
(III)
(IV)
(V)
(VI)

wherein $R_{10}$ and $R_{11}$ each independently represent a hydrogen atom, a $C_{1-20}$ straight or branched alkyl chain optionally containing one or more O atoms, or a $C_{5-50}$ monocyclic, bicyclic, or tricylic alkyl group, or $R_{10}$ and $R_{11}$ together can represent an alkylene group to form a five- or six-membered ring, $R_{12}$ represents a $C_{1-20}$ straight or branched alkyl chain optionally containing one or more O atoms, a $C_{5-50}$ monocyclic, bicyclic, or tricylic alkyl group, or a $C_{5-50}$ aralkyl group, or $R_{10}$ and $R_{12}$ together represent an alkylene group which forms a five- or six-membered ring together with the interposing —C—O— group, the carbon atom in the ring being optionally substituted by an oxygen atom, $R_{13}$ represents a $C_{1-20}$ straight or branched alkyl chain optionally containing one or more O atoms or a $C_{5-50}$ monocyclic, bicyclic, or tricylic alkyl group, $R_{14}$ and $R_{15}$ each independently represent a hydrogen atom, a $C_{1-20}$ straight or branched alkyl chain optionally containing one or more O atoms or a $C_{5-50}$ monocyclic, bicyclic, or tricylic alkyl group, $R_{16}$ represents a $C_{1-20}$ straight or branched alkyl chain optionally containing one or more O atoms, a $C_{5-50}$ monocyclic, bicyclic, or tricylic alkyl group, a $C_{5-50}$ aryl group, or a $C_{5-50}$ aralkyl group, and $R_{17}$ represents $C_{1-20}$ straight or branched alkyl chain optionally containing one or more O atoms, a $C_{5-50}$ monocyclic, bicyclic, or tricylic alkyl group, a $C_{5-50}$ aryl group, a $C_{5-50}$ aralkyl group, the group —Si($R_{16}$)$_2R_{17}$, or the group —O—Si($R_{16}$)$_2R_{17}$; and Y is a single bond or $(C_1C_6)$alkyl, with the proviso that (i) when $R_{32}$ is hydrogen, hydroxy, methyl, or t-butoxy, and (a) $R_1$ and $R_2$ are methyl or (b), $R_1$ and $R_2$ are cyclopropyl, $X^-$ is not $CF_3SO_3^-$; and (ii) when $R_{32}$ is methyl and (a) $R_1$ and $R_2$ are methyl or (b) $R_1$ and $R_2$ are cyclopropyl, $X^-$ is not $CH_2CF_3SO_3^-$.

Examples of these compounds include, without limitation, 4-hydroxyphenyl-dimethyl sulfonium nonaflate, 4-methoxyphenyl-dimethylsulfonium nonaflate, 3,5-dimethyl-4-hydroxyphenyl-dimethyl sulfonium triflate, 3,5-dimethyl-4-methoxyphenyl-dimethyl sulfonium triflate, 3,5-dimethyl-4-hydroxyphenyl-dimethyl sulfonium nonaflate, 3,5-dimethyl-4-methoxyphenyl-dimethyl sulfonium nonaflate, 4-methoxyphenyl-methyliodonium triflate or nonaflate, 3,5-dimethyl-4-hydroxyphenyl-methyliodonium triflate or nonaflate, 3,5-dimethyl-4-methoxyphenyl-methyl iodonium triflate or nonaflate, 4-t-butyl acetoxy-3,5-dimethyl phenyl dimethyl sulfonium nonaflate, 4-t-butyl acetoxy-3,5-dimethyl phenyl dimethyl sulfonium bis-perfluorobutane sulfonamide, 4-(2-methyl-2-adamantyl acetoxy)-3,5-dimethyl phenyl dimethyl sulfonium nonaflate, 4-(2-methyl-2-adamantyl acetoxy)-3,5-dimethyl phenyl dimethyl sulfonium bis-perfluorobutane sulfonamide, 4-hydroxy-3,5-dimethyl phenyl dimethyl sulfonium bis-perfluoromethane sulfonamide, 4-hydroxy-3,5-dimethyl phenyl dimethyl sulfonium bis-perfluoroethane sulfonamide, 4-hydroxy-3,5-dimethyl phenyl dimethyl sulfonium bis-perfluorobutane sulfonamide, 4-hydroxy-3,5-dimethyl phenyl dimethyl sulfonium tris-perfluoromethane sulfonmethide, and the like.

The aromatic sulfonium salts, such as triphenyl sulfonium salt, derivatives of triphenyl sulfonium salt, diphenyl iodonium salt and derivatives of diphenyl iodonium salt, (the compounds of structure (4) or (5)) provide the higher absorbing component, while the compounds of structure (1) or (2) provide the lower absorbing component. It has unexpectedly been found that by combining a higher absorbing photoactive component with a lower absorbing photoactive component that the edge roughness of the photoresist pattern can be greatly reduced while maintaining acceptable photosensitivity. It has further been found that the optimum lithographic performance is obtained when the ratio of the higher absorbing component and the lower absorbing component is in the molar ratio of from about 1:10 to about 10:1, preferably from about 1:5 to about 5:1, further preferably from about 1:2 to about 2:1, and more preferably at about 1:1. Line edge roughness improvement of greater than 20% is acceptable, greater than 35% is preferable, greater than 50% is more preferable and greater than 75% is most preferable. Acceptable levels of line edge roughness are obtained while maintaining good photosensitivity by using the components of this invention.

DESCRIPTION OF THE INVENTION

The present invention relates to a novel photoresist that can be developed with an aqueous alkaline solution, and is capable of being imaged at exposure wavelengths below 200 nm. The invention also relates to a process for imaging the novel photoresist. The novel photoresist comprises a) a polymer containing an acid labile group, and b) a novel mixture of photoactive compounds, where the mixture comprises a higher absorbing compound selected from an aromatic sulfonium salt (structure 4) and an aromatic iodonium salt (structure (5)) and a lower absorbing compound selected from structure (1) and 2.

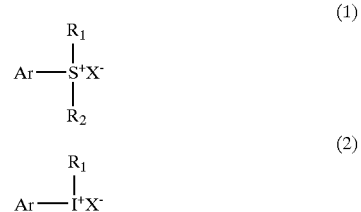

-continued

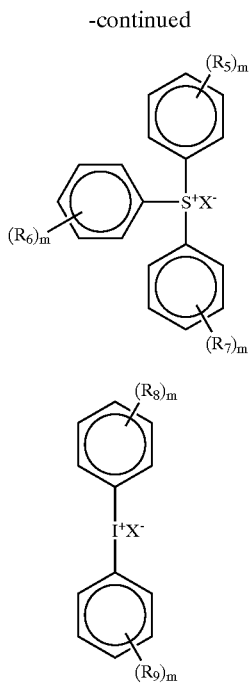

(4)

(5)

where $R_1$ and $R_2$ are independently $C_{1-20}$ straight or branched alkyl chain optionally containing one or more O atoms, $C_{5-50}$ aralkyl or $C_{5-50}$ monocyclic, bicyclic, or tricylic alkyl group; each of $R_5$, $R_6$, $R_7$, $R_8$, and $R_9$ are independently hydrogen, hydroxyl, $C_{1-20}$ straight or branched alkyl chain optionally containing one or more O atoms, $C_{5-50}$ aralkyl or $C_{5-50}$ monocyclic, bicyclic, or tricylic alkyl group; m=1–5; $X^-$ is an anion; and Ar is selected from naphthyl, anthryl, and structure (3),

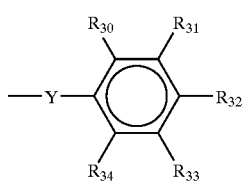

(3)

where each of $R_{30}$, $R_{31}$, $R_{32}$, $R_{33}$, and $R_{34}$ are independently selected from hydrogen, hydroxyl, $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, $C_{5-50}$ aryl group, $C_{5-50}$ arylcarbonylmethylene group, phenyl group, naphthyl group, anthryl group, peryl group, pyryl group, thienyl group, $C_{5-50}$ aralkyl group, —O—$C_{5-50}$ monocyclic, bicyclic, or tricylic alkyl group, —O—$C_{5-50}$ aryl group, —O—$C_{5-50}$ aralkyl group, —O—$C_{5-50}$ arylcarbonylmethylene group, or —O—C(=O)—O—$R_{18}$ where $R_{18}$ is $C_{1-20}$ straight or branched alkyl chain optionally containing one or more O atoms, $C_{5-50}$ monocyclic, bicyclic, or tricylic alkyl group, $C_{5-50}$ aryl, or $C_{5-50}$ aralkyl group;

the $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, phenyl group, naphthyl group, anthryl group, peryl group, pyryl group, thienyl group, $C_{5-50}$ aralkyl group, $C_{5-50}$ aryl group, or $C_{5-50}$ arylcarbonylmethylene group being unsubstituted or substituted by one or more groups selected from the group consisting of halogen, $C_{1-10}$ alkyl, $C_{3-20}$ cyclic alkyl, $C_{1-10}$ alkoxy, $C_{3-20}$ cyclic alkoxy, di $C_{1-10}$ alkylamino, dicyclic di $C_{1-10}$ alkylamino, hydroxyl, cyano, nitro, oxo, aryl, aralkyl, oxygen, aryloxy, arylthio, and groups of formulae (II) to (VI):

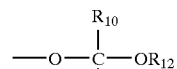

(II)

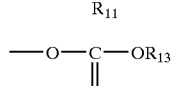

(III)

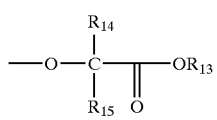

(IV)

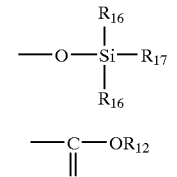

(V)

(VI)

wherein $R_{10}$ and $R_{11}$ each independently represent a hydrogen atom, a $C_{1-20}$ straight or branched alkyl chain optionally containing one or more O atoms, or a $C_{5-50}$ monocyclic, bicyclic, or tricylic alkyl group, or $R_{10}$ and $R_{11}$ together can represent an alkylene group to form a five- or six-membered ring, $R_{12}$ represents a $C_{1-20}$ straight or branched alkyl chain optionally containing one or more O atoms, a $C_{5-50}$ monocyclic, bicyclic, or tricylic alkyl group, or a $C_{5-50}$ aralkyl group, or $R_{10}$ and $R_{12}$ together represent an alkylene group which forms a five- or six-membered ring together with the interposing —C—O— group, the carbon atom in the ring being optionally substituted by an oxygen atom, $R_{13}$ represents a $C_{1-20}$ straight or branched alkyl chain optionally containing one or more O atoms or a $C_{5-50}$ monocyclic, bicyclic, or tricylic alkyl group, $R_{14}$ and $R_{15}$ each independently represent a hydrogen atom, a $C_{1-20}$ straight or branched alkyl chain optionally containing one or more O atoms or a $C_{5-50}$ monocyclic, bicyclic, or tricylic alkyl group, $R_{16}$ represents a $C_{1-20}$ straight or branched alkyl chain optionally containing one or more O atoms, a $C_{5-50}$ monocyclic, bicyclic, or tricylic alkyl group, a $C_{5-50}$ aryl group, or a $C_{5-50}$ aralkyl group, and $R_{17}$ represents $C_{1-20}$ straight or branched alkyl chain optionally containing one or more O atoms, a $C_{5-50}$ monocyclic, bicyclic, or tricylic alkyl group, a $C_{5-50}$ aryl group, a $C_{5-50}$ aralkyl group, the group —Si($R_{16}$)$_2R_{17}$, or the group —O—Si($R_{16}$)$_2R_{17}$; and Y is a single bond or ($C_{12}C_6$)alkyl.

The invention also relates to a process for imaging a photoresist comprising the steps of a) coating a substrate with the novel photoresist composition, b) baking the substrate to substantially remove the solvent, c) image-wise exposing the photoresist coating, d) postexposure baking the photoresist coating, and e) developing the photoresist coating with an aqueous alkaline solution.

The invention also relates to novel compounds useful in the above compositions and processes. The compounds are selected from

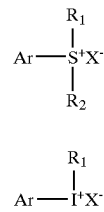

(1)

(2)

where $R_1$ and $R_2$ are independently $C_{1-20}$ straight or branched alkyl chain optionally containing one or more O atoms, $C_{5-50}$ aralkyl or $C_{5-50}$ monocyclic, bicyclic, or tricylic alkyl group; $X^-$ is an anion; and Ar is selected from naphthyl, anthryl, and structure (3),

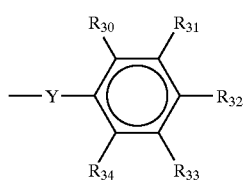

(3)

where each of $R_{30}$, $R_{31}$, $R_{32}$, $R_{33}$, and $R_{34}$ are independently selected from hydrogen, hydroxyl, $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, $C_{5-50}$ aryl group, $C_{5-50}$ arylcarbonylmethylene group, phenyl group, naphthyl group, anthryl group, peryl group, pyryl group, thienyl group, $C_{5-50}$ aralkyl group, —O—$C_{5-50}$ monocyclic, bicyclic, or tricylic alkyl group, —O—$C_{5-50}$ aryl group, —O—$C_{5-50}$ aralkyl group, —O—$C_{5-50}$ arylcarbonylmethylene group, or —O—C(=O)—O—$R_{18}$ where $R_{18}$ is $C_{1-20}$ straight or branched alkyl chain optionally containing one or more O atoms, $C_{5-50}$ monocyclic, bicyclic, or tricylic alkyl group, $C_{5-50}$ aryl, or $C_{5-50}$ aralkyl group;

the $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, phenyl group, naphthyl group, anthryl group, peryl group, pyryl group, thienyl group, $C_{5-50}$ aralkyl group, $C_{5-50}$ aryl group, or $C_{5-50}$ arylcarbonylmethylene group being unsubstituted or substituted by one or more groups selected from the group consisting of halogen, $C_{1-10}$ alkyl, $C_{3-20}$ cyclic alkyl, $C_{1-10}$ alkoxy, $C_{3-20}$ cyclic alkoxy, di $C_{1-10}$ alkylamino, dicyclic di $C_{1-10}$ alkylamino, hydroxyl, cyano, nitro, oxo, aryl, aralkyl, oxygen, aryloxy, arylthio, and groups of formulae (II) to (VI):

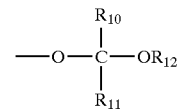

(II)

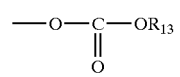

(III)

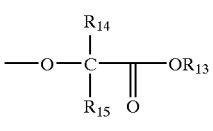

(IV)

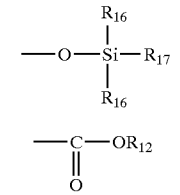

(V)

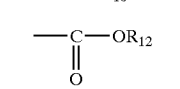

(VI)

wherein $R_{10}$ and $R_{11}$ each independently represent a hydrogen atom, a $C_{1-20}$ straight or branched alkyl chain optionally containing one or more O atoms, or a $C_{5-50}$ monocyclic, bicyclic, or tricylic alkyl group, or $R_{10}$ and $R_{11}$ together can represent an alkylene group to form a five- or six-membered ring, $R_{12}$ represents a $C_{1-20}$ straight or branched alkyl chain optionally containing one or more O atoms, a $C_{5-50}$ monocyclic, bicyclic, or tricylic alkyl group, or a $C_{5-50}$ aralkyl group, or $R_{10}$ and $R_{12}$ together represent an alkylene group which forms a five- or six-membered ring together with the interposing —C—O— group, the carbon atom in the ring being optionally substituted by an oxygen atom, $R_{13}$ represents a $C_{1-20}$ straight or branched alkyl chain optionally containing one or more O atoms or a $C_{5-50}$ monocyclic, bicyclic, or tricylic alkyl group, $R_{14}$ and $R_{15}$ each independently represent a hydrogen atom, a $C_{1-20}$ straight or branched alkyl chain optionally containing one or more O atoms or a $C_{5-50}$ monocyclic, bicyclic, or tricylic alkyl group, $R_{16}$ represents a $C_{1-20}$ straight or branched alkyl chain optionally containing one or more O atoms, a $C_{5-50}$ monocyclic, bicyclic, or tricylic alkyl group, a $C_{5-50}$ aryl group, or a $C_{5-50}$ aralkyl group, and $R_{17}$ represents $C_{1-20}$ straight or branched alkyl chain optionally containing one or more O atoms, a $C_{5-50}$ monocyclic, bicyclic, or tricylic alkyl group, a $C_{5-50}$ aryl group, a $C_{5-50}$ aralkyl group, the group —Si($R_{16}$)$_2$$R_{17}$, or the group —O—Si($R_{16}$)$_2$$R_{17}$; and Y is a single bond or ($C_1$–$C_6$)alkyl, with the proviso that (i) when $R_{32}$ is hydrogen, hydroxy, methyl, or t-butoxy, and (a) $R_1$ and $R_2$ are methyl or (b), $R_1$ and $R_2$ are cyclopropyl, $X^-$ is not $CF_3SO_3^-$; and (ii) when $R_{32}$ is methyl and (a) $R_1$ and $R_2$ are methyl or (b) $R_1$ and $R_2$ are cyclopropyl, $X^-$ is not $CH_2CF_3SO_3^-$.

Examples of these compounds include, without limitation, 4-hydroxyphenyl-dimethyl sulfonium nonaflate, 4-methoxyphenyl-dimethylsulfonium nonaflate, 3,5-dim ethyl-4-hydroxyphenyl-dimethyl sulfonium triflate, 3,5-dimethyl-4-methoxyphenyl-dimethyl sulfonium triflate, 3,5-dimethyl-4-hydroxyphenyl-dimethyl sulfonium nonaflate, 3,5-dimethyl-4-methoxyphenyl-dimethyl sulfonium nonaflate, 4-methoxyphenyl-methyliodonium triflate or nonaflate, 3,5-dimethyl-4-hydroxyphenyl-methyliodonium triflate or nonaflate, 4-hydroxyphenyl-methyl iodonium triflate or nonaflate, 3,5-dimethyl-4-methoxyphenyl-methyl iodonium triflate or nonaflate, 4-t-butyl acetoxy-3,5-dimethyl phenyl dimethyl sulfonium nonaflate, 4-t-butyl acetoxy-3,5-dimethyl phenyl dimethyl sulfonium bis-perfluorobutane sulfonamide, 4-(2-methyl-2-adamantyl acetoxy)-3,5-dimethyl phenyl dimethyl sulfonium nonaflate, 4-(2-methyl-2-adamantyl acetoxy)-3,5-dimethyl phenyl dimethyl sulfonium bis-perfluorobutane sulfonamide, 4-hydroxy-3,5-dimethyl phenyl dimethyl sulfonium bis-perfluoromethane sulfonamide, 4-hydroxy-3,5-dimethyl phenyl dimethyl sulfonium bis-perfluoroethane sulfonamide, 4-hydroxy-3,5-dimethyl phenyl dimethyl sulfonium bis-perfluorobutane sulfonamide, 4-hydroxy-3,5-dimethyl phenyl dimethyl sulfonium tris-perfluoromethane sulfonmethide, and the like. Examples of other sulfonium photoacid generators can be found in U.S. Pat. No. 6,420,085.

The aromatic sulfonium salts, such as triphenyl sulfonium salt, derivatives of triphenyl sulfonium salt, diphenyl iodonium salt and derivatives of diphenyl iodonium salt, (the compounds of structure (4) or (5)) provide the higher absorbing component, while the compounds of structure (1) or (2) provide the lower absorbing component. It has unexpectedly been found that by combining a higher absorbing photoactive component with a lower absorbing photoactive component that the edge roughness of the photoresist pattern can be greatly reduced while maintaining acceptable photosensitivity. It has further been found that the optimum lithographic performance is obtained when the ratio of the higher absorbing component and the lower absorbing component is in the molar ratio of from about 1:10 to about 10:1, preferably from about 1:5 to about 5:1, further preferably from about 1:2 to about 2:1, and more preferably at about 1:1. Line edge roughness improvement of greater than 20% is acceptable, greater than 35% is preferable, greater than 50% is more preferable and greater than 75% is most preferable. Acceptable levels of line edge roughness are obtained while maintaining good photosensitivity by using the components of this invention.

The higher absorbing photoactive components are aromatic iodonium and sulfonium salts of structure (4) and 5.

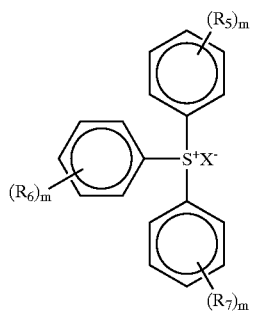

(4)

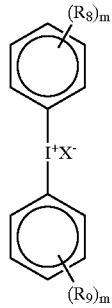

(5)

where, each of $R_5$, $R_6$, $R_7$, $R_8$, and $R_9$ are independently hydrogen, hydroxyl, $(C_1-C_6)$alkyl, and $(C_1-C_6)$aliphatic hydrocarbon containing one or more O atoms, m=1–5, and $X^-$ is an anion. Examples are diphenyliodonium salts, triphenylsulfonium salts and the like. Examples of $X^-$ are trifluoromethane sulfonate (triflate), 1,1,1,2,3,3-hexafluoropropanesulfonate, perfluorobutanebutanesulfonate (nonaflate), camphor sulfonate, perfluorooctane sulfonate, benzene sulfonate, pentafluorobenzene sulfonate, and toluenesulfonate. Further examples of $X^-$ include $CHF_2SO_3^-$, $CH_3SO_3^-$, $CCl_3SO_3^-$, $C_2F_5SO_3^-$, $C_2HF_4SO_3^-$, $(R_fSO_2)_3C^-$ and $(R_fSO_2)_2N^-$, wherein each $R_f$ is independently selected from the group consisting of highly fluorinated or perfluorinated alkyl or fluorinated aryl radicals and may be cyclic, when a combination of any two $R_f$ groups are linked to form a bridge, further, the $R_f$ alkyl chains contain from 1–20 carbon atoms and may be straight, branched, or cyclic, such that divalent oxygen, trivalent nitrogen or hexavalent sulfur may interrupt the skeletal chain, further when $R_f$ contains a cyclic structure, such structure has 5 or 6 ring members, optionally, (1) or (2) of which are heteroatoms. Examples include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(CF_3SO_2)(C_4F_9SO_2)N^-$, $(C_2F_5SO_2)_3C^-$, $(C_4F_9SO_2)_3C^-$, $(CF_3SO_2)_2(C_2F_5SO_2)C^-$, $(C_4F_9SO_2)(C_2F_5SO_2)_2C^-$, $(CF_3SO_2)(C_4F_9SO_2)N^-$, $[(CF_3)_2NC_2F_4SO_2]_2N^-$, $(CF_3)_2NC_2F_4SO_2C^-(SO_2CF_3)_2$, $(3,5-bis(CF_3)C_6H_3)SO_2N^-SO_2CF_3$, $C_6F_5SO_2C^-(SO_2CF_3)_2$, $C_6F_5SO_2N^-SO_2CF_3$,

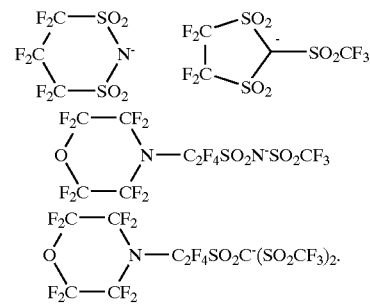

Some examples, without limitation are, of sulfonium salts are triphenylsulfonium salts, trialkylphenylsulfonium salts, (p-tert-butoxyphenyl)triphenylsulfonium salts, bis(p-tert-butoxyphenyl)phenylsulfonium salts, and tris(p-tert-butoxyphenyl)sulfonium salts. Some examples, without limitation, of iodonium salts are diphenyliodonium salts, di(alkylphenyl)iodonium salts, and the like, etc. The counter ion, $X^-$, may be any ion that gives good lithographic properties, and examples of which are fluoroalkylsulfonates such as 1,1,1-trifluoromethanesulfonate (also referred to as triflate) and nonafluorobutanesulfonate (also referred to as nonaflate), arylsulfonates such as tosylate, benzenesulfonate, 4-fluorobenzenesulfonate, and alkylsulfonates such as mesylate and butanesulfonate. Preferred salts are diphenyliodonium trifluoromethane sulfonate, diphenyliodonium nonafluorobutanesufonate, triphenylsulfonium trifluromethanesuflonate, and triphenylsulfonium nonafluorobutanesufonate. Information regarding the counter ion X⁻ can be found, for example, at W. M. Lamanna et al., Advances in Resist Technology and Processing XIX, SPIE, Vol. 4690, pp817–828 (2002) and U.S. Pat. No. 5,554,664.

The lower absorbing photoactive component is a compound of structure (1) or 2.

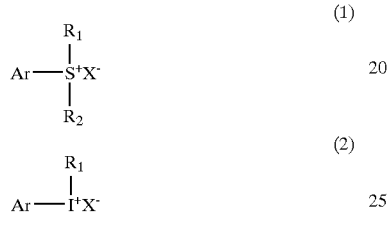

where $R_1$ and $R_2$ are independently $C_{1-20}$ straight or branched alkyl chain optionally containing one or more O atoms, $C_{5-50}$ aralkyl or $C_{5-50}$ monocyclic, bicyclic, or tricylic alkyl group; X⁻ is an anion; and Ar is selected from naphthyl, anthryl, and structure (3),

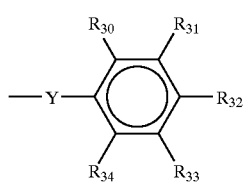

where each of $R_{30}$, $R_{31}$, $R_{32}$, $R_{33}$, and $R_{34}$ are independently selected from hydrogen, hydroxyl, $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, $C_{5-50}$ aryl group, $C_{5-50}$ arylcarbonylmethylene group, phenyl group, naphthyl group, anthryl group, peryl group, pyryl group, thienyl group, $C_{5-50}$ aralkyl group, —O—$C_{5-50}$ monocyclic, bicyclic, or tricylic alkyl group, —O—$C_{5-50}$ aryl group, —O—$C_{5-50}$ aralkyl group, —O—$C_{5-50}$ arylcarbonylmethylene group, or —O—C(=O)—O—$R_{18}$ where $R_{18}$ is $C_{1-20}$ straight or branched alkyl chain optionally containing one or more O atoms, $C_{5-50}$ monocyclic, bicyclic, or tricylic alkyl group, $C_{5-50}$ aryl, or $C_{5-50}$ aralkyl group;

the $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, phenyl group, naphthyl group, anthryl group, peryl group, pyryl group, thienyl group, $C_{5-50}$ aralkyl group, $C_{5-50}$ aryl group, or $C_{5-50}$ arylcarbonylmethylene group being unsubstituted or substituted by one or more groups selected from the group consisting of halogen, $C_{1-10}$ alkyl, $C_{3-20}$ cyclic alkyl, $C_{1-10}$ alkoxy, $C_{3-20}$ cyclic alkoxy, di $C_{1-10}$ alkylamino, dicyclic di $C_{1-10}$ alkylamino, hydroxyl, cyano, nitro, oxo, aryl, aralkyl, oxygen, aryloxy, arylthio, and groups of formulae (II) to (VI):

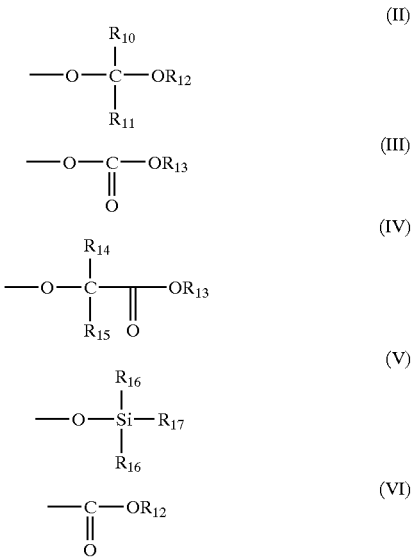

wherein $R_{10}$ and $R_{11}$ each independently represent a hydrogen atom, a $C_{1-20}$ straight or branched alkyl chain optionally containing one or more O atoms, or a $C_{5-50}$ monocyclic, bicyclic, or tricylic alkyl group, or $R_{10}$ and $R_{11}$ together can represent an alkylene group to form a five- or six-membered ring, $R_{12}$ represents a $C_{1-20}$ straight or branched alkyl chain optionally containing one or more O atoms, a $C_{5-50}$ monocyclic, bicyclic, or tricylic alkyl group, or a $C_{5-50}$ aralkyl group, or $R_{10}$ and $R_{12}$ together represent an alkylene group which forms a five- or six-membered ring together with the interposing —C—O— group, the carbon atom in the ring being optionally substituted by an oxygen atom, $R_{13}$ represents a $C_{1-20}$ straight or branched alkyl chain optionally containing one or more O atoms or a $C_{5-50}$ monocyclic, bicyclic, or tricylic alkyl group, $R_{14}$ and $R_{15}$ each independently represent a hydrogen atom, a $C_{1-20}$ straight or branched alkyl chain optionally containing one or more O atoms or a $C_{5-50}$ monocyclic, bicyclic, or tricylic alkyl group, $R_{16}$ represents a $C_{1-20}$ straight or branched alkyl chain optionally containing one or more O atoms, a $C_{5-50}$ monocyclic, bicyclic, or tricylic alkyl group, a $C_{5-50}$ aryl group, or a $C_{5-50}$ aralkyl group, and $R_{17}$ represents $C_{1-20}$ straight or branched alkyl chain optionally containing one or more O atoms, a $C_{5-50}$ monocyclic, bicyclic, or tricylic alkyl group, a $C_{5-50}$ aryl group, a $C_{5-50}$ aralkyl group, the group —Si($R_{16}$)$_2$$R_{17}$, or the group —O—Si($R_{16}$)$_2$$R_{17}$; and Y is a single bond or ($C_1$–$C_6$)alkyl.

The $C_{1-20}$ straight or branched alkyl chain optionally containing one or more O atoms can be groups such as methyl, ethyl, propyl, butyl, pentyl, hexyl, isopropyl, t-butyl, hexyl, and the like. When containing one or more O atoms, the $C_{1-20}$ straight or branched alkyl chain optionally containing one or more O atoms can be any alkyl group with linkages such as ether, keto, carboxyl, or other O based linkages. The $C_{5-50}$ monocyclic, bicyclic, or tricylic alkyl group has up to 50 carbon atoms, examples of which are cyclopentyl, cyclohexyl, cyclooctyl, norbornyl, isonorbornyl and adamantyl. The aromatic group, Ar, may be connected directly to the sulfonium ion or have a linking alkylene group with up to 6 alkyl carbon atoms. The aromatic group may be phenyl, naphthyl or anthryl and their derivatives. The phenyl group has the structure (3), examples of which are 4-methoxyphenyl, 4-hydroxyphenyl, 3,5-dimethyl-4-hydroxyphenyl and 3,5-dimethyl-4-methoxyphenyl. Other groups that illustrate the derivatives of the naphthyl and anthryl functionality, but are not limited to, are alkylnaphthyl, dialkylnaphthyl, alkylanthryl, dialkylanthryl, alkoxynaphthyl, alkoxyanthryl, dialkoxynaphthyl, dialkoxyanthryl examples of which are methylnaphthyl, ethyinaphthyl, methylanthryl, ethylanthryl, methoxy naphthyl, ethoxynaphthyl, methoxynaphthyl, ethoxyanthryl and others.

In some examples, Y is a single bond, in which, the aromatic group is connected directly to the sulfonium ion, and the aromatic group is phenyl or substituted phenyl, preferably methoxydimethylphenyl dimethyl sulfonium salts, methoxyphenyl dimethylsulfonium salts, hydroxydimethylphenyl dimethyl sulfonium salts, and hydroxyphenyl dimethylsulfonium salts.

In other examples, Y is also a single bond, the aromatic group is substituted phenyl, each of $R_{30}$, $R_{31}$, $R_{33}$, and $R_{34}$ are independently selected from hydrogen or $C_{1-20}$ straight or branched alkyl chain optionally containing one or more O atoms, each of $R_1$ and $R_2$ are independently $C_{1-20}$ straight or branched alkyl chain optionally containing one or more O atoms or $C_{5-50}$ monocyclic, bicyclic, or tricylic alkyl group, and $R_{32}$ is hydroxy, —O—$C_{1-20}$ straight or branched alkyl chain optionally containing one or more O atoms, —O—$C_{5-50}$ aryl group, or —O—C(=O)—O—$R_{18}$ where $R_{18}$ is $C_{1-20}$ straight or branched alkyl chain optionally containing one or more O atoms or $C_{5-50}$ monocyclic, bicyclic, or tricylic alkyl group, the $C_{1-20}$ straight or branched alkyl chain optionally containing one or more O atoms or $C_{5-50}$ monocyclic, bicyclic, or tricylic alkyl group being unsubstituted or substituted as described above, and more particularly substituted by one or more groups selected from the group consisting of halogen, $C_{1-10}$ alkyl, $C_{3-20}$ cyclic alkyl, $C_{1-10}$ alkoxy, $C_{3-20}$ cyclic alkoxy, di $C_{1-10}$ alkylamino, dicyclic di $C_{1-10}$ alkylamino, hydroxyl, cyano, nitro, or aryl.

In certain selections, when $R_1$ and $R_2$ are as described above, and $R_{32}$ is hydroxy, —O—$C_{1-20}$ straight or branched alkyl chain optionally containing one or more O atoms, or —O—C(=O)—O—$R_{18}$ where $R_{18}$ is $C_{1-20}$ straight or branched alkyl chain optionally containing one or more O atoms or $C_{5-50}$ monocyclic, bicyclic, or tricylic alkyl group, the $C_{5-50}$ monocyclic, bicyclic, or tricylic alkyl group being unsubstituted or substituted by one or more groups selected from the group consisting of halogen, $C_{1-10}$ alkyl, $C_{3-20}$ cyclic alkyl, $C_{1-10}$ alkoxy, $C_{3-20}$ cyclic alkoxy, di $C_{1-10}$ alkylamino, dicyclic di $C_{1-10}$ alkylamino, hydroxyl, cyano, nitro, or aryl, examples of, but not limited to, each of $R_{30}$, $R_{31}$, $R_{33}$ and $R_{34}$ can be selected as follows:

each of $R_{30}$, $R_{31}$, $R_{33}$, and $R_{34}$ are hydrogen;

each of $R_{30}$, $R_{31}$, and $R_{33}$ are hydrogen and $R_{34}$ is $C_{1-20}$ straight or branched alkyl chain optionally containing one or more O atoms;

each of $R_{30}$, $R_{31}$, and $R_{34}$ are hydrogen and $R_{33}$ is $C_{1-20}$ straight or branched alkyl chain optionally containing one or more O atoms;

each of $R_{30}$, $R_{33}$, and $R_{34}$ are hydrogen and $R_{31}$ is $C_{1-20}$ straight or branched alkyl chain optionally containing one or more O atoms;

each of $R_{31}$, $R_{33}$, and $R_{34}$ are hydrogen and $R_{30}$ is $C_{1-20}$ straight or branched alkyl chain optionally containing one or more O atoms;

each of $R_{30}$ and $R_{31}$ are hydrogen and each of $R_{33}$ and $R_{34}$ are $C_{1-20}$ straight or branched alkyl chain optionally containing one or more O atoms;

each of $R_{30}$ and $R_{33}$ are hydrogen and each of $R_{31}$ and $R_{34}$ are $C_{1-20}$ straight or branched alkyl chain optionally containing one or more O atoms;

each of $R_{30}$ and $R_{34}$ are hydrogen and each of $R_{31}$ and $R_{33}$ are $C_{1-20}$ straight or branched alkyl chain optionally containing one or more O atoms;

each of $R_{31}$ and $R_{33}$ are hydrogen and each of $R_{30}$ and $R_{34}$ are $C_{1-20}$ straight or branched alkyl chain optionally containing one or more O atoms;

each of $R_{31}$ and $R_{34}$ are hydrogen and each of $R_{30}$ and $R_{33}$ are $C_{1-20}$ straight or branched alkyl chain optionally containing one or more O atoms;

each of $R_{33}$ and $R_{34}$ are hydrogen and each of $R_{30}$ and $R_{31}$ are $C_{1-20}$ straight or branched alkyl chain optionally containing one or more O atoms;

$R_{30}$ is hydrogen and each of $R_{31}$, $R_{33}$ and $R_{34}$ are $C_{1-20}$ straight or branched alkyl chain optionally containing one or more O atoms;

$R_{31}$ is hydrogen and each of $R_{30}$, $R_{33}$ and $R_{34}$ are $C_{1-20}$ straight or branched alkyl chain optionally containing one or more O atoms;

$R_{33}$ is hydrogen and each of $R_{30}$, $R_3$, and $R_{34}$ are $C_{1-20}$ straight or branched alkyl chain optionally containing one or more O atoms;

$R_{34}$ is hydrogen and each of $R_{30}$, $R_{31}$ and $R_{33}$ are $C_{1-20}$ straight or branched alkyl chain optionally containing one or more O atoms; or each of $R_{30}$, $R_{31}$, $R_{33}$ and $R_{34}$ are $C_{1-20}$ straight or branched alkyl chain optionally containing one or more O atoms, where the $C_{1-20}$ straight or branched alkyl chain optionally containing one or more O atoms is unsubstituted or substituted.

Examples of the lower absorbing photoactive compound, without limitations, are 4-hydroxyphenyl-dimethyl sulfonium triflate or nonaflate, 4-methoxyphenyl-dimethylsulfonium triflate, 3,5-dimethyl-4-hydroxyphenyl-dimethyl sulfonium triflate, 3,5-dimethyl-4-methoxyphenyl-dimethyl sulfonium triflate, 3,5-dimethyl-4-hydroxyphenyl-dimethyl sulfonium nonaflate, 3,5-dimethyl-4-methoxyphenyl-dimethyl sulfonium nonaflate, 4-methoxyphenyl-methyliodonium triflate or nonaflate, 4-hydroxyphenyl-methyl iodonium triflate or nonaflate, 3,5-dimethyl-4-hydroxyphenyl-methyliodonium triflate or nonaflate, 3,5-dimethyl-4-methoxyphenyl-methyl iodonium triflate or nonaflate, 4-t-butyl acetoxy-3,5-dimethyl phenyl dimethyl sulfonium nonaflate, 4-t-butyl acetoxy-3,5-dimethyl phenyl dimethyl sulfonium bis-perfluorobutane sulfonamide, 4-(2-methyl-2-adamantyl acetoxy)-3,5-dimethyl phenyl dimethyl sulfonium nonaflate, 4-(2-methyl-2-adamantyl acetoxy)-3,5-dimethyl phenyl dimethyl sulfonium bis-perfluorobutane sulfonamide, 4-hydroxy-3,5-dimethyl phenyl dimethyl sulfonium bis-perfluoromethane sulfonamide, 4-hydroxy-3,5-dimethyl phenyl dimethyl sulfonium bis-perfluoroethane sulfonamide, 4-hydroxy-3,5-dimethyl phenyl dimethyl sulfonium bis-perfluorobutane sulfonamide, and 4-hydroxy-3,5-dimethyl phenyl dimethyl sulfonium tris-perfluoromethane sulfonmethide.

One of the preferred mixtures of photoactive compounds is a mixture of triphenylsulfonium triflate or nonaflate with 3,5-dimethyl,4-methoxyphenylsulfonium triflate or nonaflate.

The polymer of the invention is one that has acid labile groups that make the polymer insoluble in aqueous alkaline solution, but such a polymer in the presence of an acid catalytically deprotects the polymer, wherein the polymer then becomes soluble in an aqueous alkaline solution. The polymers preferably are transparent below 200 nm, and are essentially non-aromatic, and preferably are acrylates and/or cycloolefin polymers. Such polymers are, for example, but not limited to, those described in U.S. Pat. No. 5,843,624, U.S. Pat. No. 5,879,857, WO 97/33,198, EP 789,278 and GB 2,332,679. Nonaromatic polymers that are preferred for irradiation below 200 nm are substituted acrylates, cycloolefins, substituted polyethylenes, and the like, etc. Aromatic polymers based on polyhydroxystyrene and its copolymers may also be used, especially for 248 nm exposure. Preferred comonomers are methacrylates.

Polymers based on acrylates are generally based on poly(meth)acrylates with at least one unit containing pendant alicyclic groups, and with the acid labile group being pendant from the polymer backbone and/or from the alicyclic group. Examples of pendant alicyclic groups, may be adamantyl, tricyclodecyl, isobornyl, menthyl and their derivatives. Other pendant groups may also be incorporated into the polymer, such as mevalonic lactone, gamma butyrolactone, alkyloxyalkyl, and the like, etc. More preferred structures for the alicyclic group are:

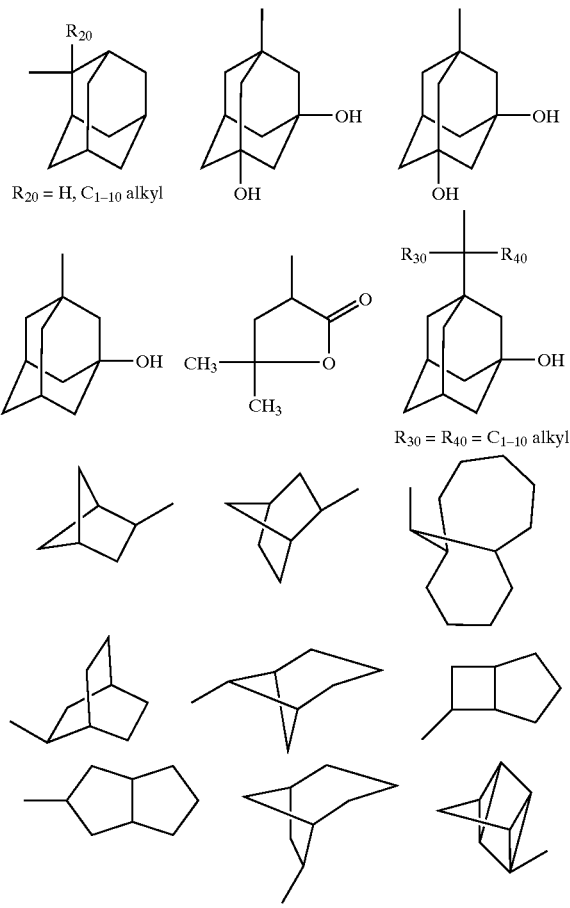

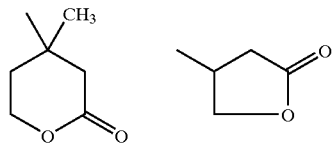

The type of monomers and their ratios incorporated into the polymer are optimized to give the best lithographic performance. Such polymers are described in R. R. Dammel et al., Advances in Resist Technology and Processing, SPIE, Vol. 3333, p144, (1998). Examples of these polymers include poly(2-methyl-2-adamantane methacrylate-co-mevalonic lactone methacrylate), poly(carboxy-tetracyclododecyl methacrylate-co-tetrahydropyranylcarboxytetracyclododecyl methacrylate), poly(tricyclodecylacrylate-co-tetrahydropyranylmethacrylate-co-methacrylicacid), poly(3-oxocyclohexyl methacrylate-co-adamantylmethacrylate).

Polymers synthesized from cycloolefins, with norbornene and tetracyclododecene derivatives, may be polymerized by ring-opening metathesis, free-radical polymerization or using metal organic catalysts. Cycloolefin derivatives may also be copolymerized with cyclic anhydrides or with maleimide or its derivatives. Examples of cyclic anhydrides are maleic anhydride and itaconic anhydride. The cycloolefin is incorporated into the backbone of the polymer and may be any substituted or unsubstituted multicyclic hydrocarbon containing an unsaturated bond. The monomer can have acid labile groups attached. The polymer may be synthesized from one or more cycloolefin monomers having an unsaturated bond. The cycloolefin monomers may be substituted or unsubstituted norbornene, or tetracyclododecane. The substituents on the cycloolefin may be aliphatic or cycloaliphatic alkyls, esters, acids, hydroxyl, nitrile or alkyl derivatives. Examples of cycloolefin monomers, without limitation, are:

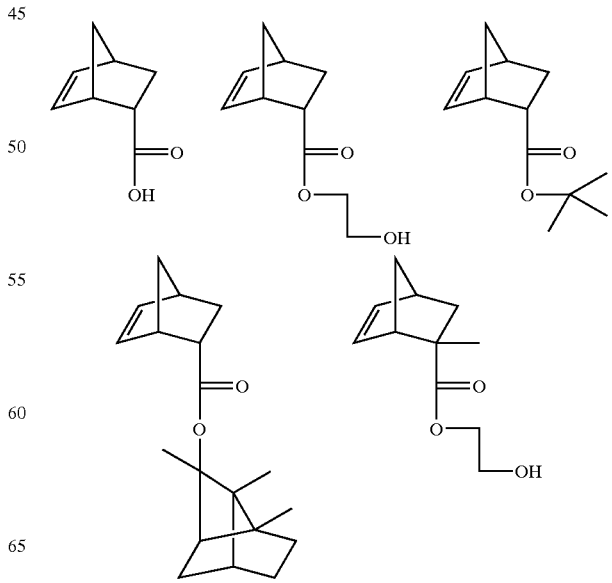

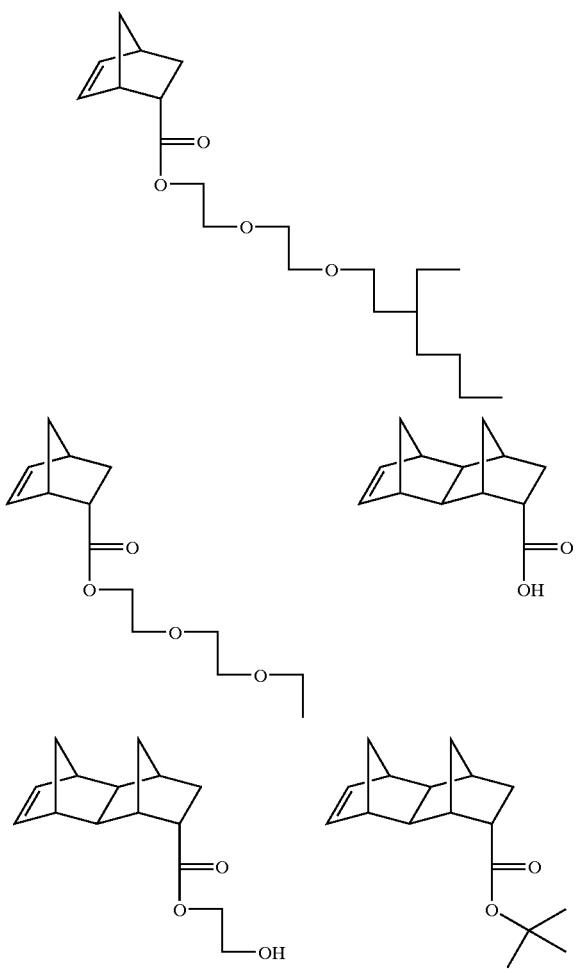

Other cycloolefin monomers which may also be used in synthesizing the polymer are:

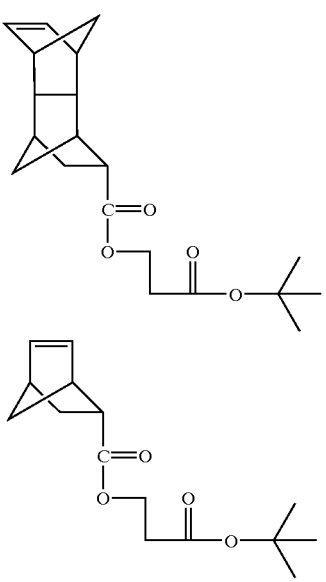

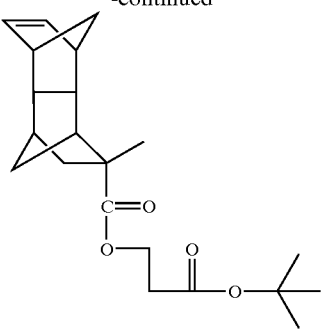

Such polymers are described in the following reference and incorporated herein, M-D. Rahman et al, Advances in Resist Technology and Processing, SPIE, Vol. 3678, p1193, (1999). Examples of these polymers include poly(t-butyl 5-norbornene-2-carboxylate-co-2-hydroxyethyl 5-norbornene-2-carboxylate-co-5-norbornene-2-carboxylic acid-co-maleic anhydride), poly(t-butyl 5-norbornene-2-carboxylate-co-isobornyl-5-norbornene-2-carboxylate-co-2-hydroxyethyl 5-norbornene-2-carboxylate-co-5-norbornene-2-carboxylic acid-co-maleic anhydride), poly (tetracyclododecene-5-carboxylate-co-maleic anhydride), poly(t-butyl 5-norbornene-2-carboxylate-co-maleic anhydride-co-2-methyladamantyl methacrylate-co-2-mevalonic lactone methacrylate), poly(2-methyladamantyl methacrylate-co-2-mevalonic lactone methacylate) and the like.

Polymers containing mixtures of acrylate monomers, cycloolefinic monomers and cyclic anhydrides, where such monomers are described above, may also be combined into a hybrid polymer. Examples of the cycloolefin monomers include those selected from t-butyl norbornene carboxylate (BNC), hydroxyethyl norbornene carboxylate (HNC), norbornene carboxylic acid (NC), t-butyl tetracyclo[4.4.0.1.$^{2,}$$^{6}$1.$^{7,10}$]dodec-8-ene-3-carboxylate, and t-butoxycarbonylmethyl tetracyclo[4.4.0.1.$^{2,6}$1.$^{7,10}$]dodec-8-ene-3-carboxylate. Examples of acrylate monomers include those selected from mevaloniclactone methacrylate (MLMA), 2-methyladamantyl methacrylate (MAdMA), isoadamantyl methacrylate, 3-hydroxy-1-methacryloxyadamatane, 3,5-dihydroxy-1-methacryloxyadamantane, β-methacryloxy-γ-butyrolactone, and α-methacryloxy-γ-butyrolactone. An example of cyclic anhydride is maleic anhydride.

The cycloolefin and the cyclic anhydride monomer are believed to form an alternating polymeric structure, and the amount of the acrylate monomer incorporated into the polymer can be varied to give the optimal lithographic properties. The percentage of the acrylate monomer relative to the cycloolefin/anhydride monomers within the polymer ranges from about 95 mole % to about 5 mole %, preferably from about 75 mole % to about 25 mole %, and most preferably from about 55 mole % to about 45 mole %.

Fluorinated non-phenolic polymers, useful for 157 nm exposure, also exhibit line edge roughness and can benefit from the use of the novel mixture of photoactive compounds described in the present invention. Such polymers are described in WO 00/17712 and WO 00/67072 and incorporated herein by reference. Example of one such polymer is poly(tetrafluoroethylene-co-norbornene-co-5-hexafluoroisopropanol-substituted 2-norborne.

Polymers synthesized from cycloolefins and cyano containing ethylenic monomers are described in the U.S. patent application Ser. No. 09/854,312, filed May 11, 2001, the contents of which are hereby incorporated herein by reference, may also be used. Other polymers, such as those disclosed in U.S. patent application Ser. No. 10/371,262, filed Feb. 21, 2003, the contents of which are hereby incorporated herein by reference, may also be used. Still other polymers, such as those disclosed in U.S. patent application Ser. No. 10/440,542, filed May 16, 2003 and titled "Photoresist Composition for Deep UV and Process Thereof", the contents of which are hereby incorporated herein by reference, may also be used.

The molecular weight of the polymers is optimized based on the type of chemistry used and on the lithographic performance desired. Typically, the weight average molecular weight is in the range of 3,000 to 30,000 and the polydispersity is in the range 1.1 to 5, preferably 1.5 to 2.5.

The solid components of the present invention are dissolved in an organic solvent. The amount of solids in the solvent or mixture of solvents ranges from about 5 weight % to about 50 weight %. The polymer may be in the range of 5 weight % to 90 weight % of the solids and the photoacid generator may be in the range of 2 weight % to about 50 weight % of the solids. Suitable solvents for such photoresists may include a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

Various other additives such as colorants, non-actinic dyes, anti-striation agents, plasticizers, adhesion promoters, dissolution inhibitors, coating aids, photospeed enhancers, and solubility enhancers (for example, certain small levels of solvents not used as part of the main solvent (examples of which include glycol ethers and glycol ether acetates, valerolactone, ketones, lactones, and the like), and surfactants may be added to the photoresist composition before the solution is coated onto a substrate. Surfactants that improve film thickness uniformity, such as fluorinated surfactants, can be added to the photoresist solution. A sensitizer that transfers energy from a particular range of wavelengths to a different exposure wavelength may also be added to the photoresist composition. Often bases are also added to the photoresist to prevent t-tops or bridging at the surface of the photoresist image. Examples of bases are amines, ammonium hydroxide, and photosensitive bases. Particularly preferred bases are trioctylamine, diethanolamine and tetrabutylammonium hydroxide.

The prepared photoresist composition solution can be applied to a substrate by any conventional method used in the photoresist art, including dipping, spraying, and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over antireflective coatings.

The photoresist coatings produced by the described procedure are particularly suitable for application to silicon/silicon dioxide wafers, such as are utilized in the production of microprocessors and other miniaturized integrated circuit components. An aluminum/aluminum oxide wafer can also be used. The substrate may also comprise various polymeric resins, especially transparent polymers such as polyesters.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature. Treatment is conducted until substantially all of the solvents have evaporated and a thin coating of photoresist composition, on the order of half a micron (micrometer) in thickness, remains on the substrate. In a preferred embodiment the temperature is from about 95° C. to about 120° C. The treatment is conducted until the rate of change of solvent removal becomes relatively insignificant. The film thickness, temperature and time selection depends on the photoresist properties desired by the user, as well as the equipment used and commercially desired coating times. The coated substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, and the like, etc.

The photoresist is then subjected to a post exposure second baking or heat treatment before development. The heating temperatures may range from about 90° C. to about 150° C., more preferably from about 100° C. to about 130° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred developer is an aqueous solution of tetramethyl ammonium hydroxide. After removal of the coated wafers from the developing solution, one may conduct an optional post-development heat treatment or bake to increase the coating's adhesion and chemical resistance to etching conditions and other substances.

The post-development heat treatment can comprise the oven baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid base etching solution or dry etching. Prior to dry etching the photoresist may be treated to electron beam curing in order to increase the dry-etch resistance of the photoresist.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

The refractive index (n) and the absorption (k) values of the photoresist in the Examples below were measured on a J. A. Woollam VASE32 ellipsometer.

The triphenyl sulfonium nonafluorobutane sulfonate used in the photoresist formulation is available from Toyo Gosei Company Ltd. Japan.

The line edge roughness (LER) was measured on a KLA8100 CD SEM tool using 600V acceleration voltage, 100K magnification and with a threshold of 50%. The length of the photoresist line measured was 1.5 μm. LER was the (3σ) value calculated using 24 data points on each side of the photoresist line.

Example 1

4-methoxyphenyl dimethyl sulfonium triflate

To a 500 ml round bottomed flask equipped with a thermometer, a mechanical stirrer, and a condenser, 1-methoxy-4-(methylthio) benzene (25 g, 0.162 mole), silver triflate (42.2 g, 0.164 mole) and 300 g tetrahydrofuran (THF) were added. The mixture was heated at 40° C. to dissolve all the solids. A clear solution was cooled to room temperature and iodomethane (23.5 g, 0.166 mole) was added dropwise from a dropping funnel. The precipitate formed immediately during the addition of iodomethane. An exotherm was observed and the temperature rose to 55° C. The reaction mixture was stirred for 4 hours and the precipitate was filtered out. The solution was dark and the THF was reduced under vacuum. The solution was added drop wise to one liter of ether. The precipitate was dissolved in dichloromethane (200 ml) and filtered to remove silver oxide. The filtrate was drowned in ether (1 liter) and the white precipitate was filtered and dried under vacuum at 35° C. (white crystals). The yield was 16.0 g (33%). The solid product gave the following analytical $^1$H NMR(Acetone-d6) results: 3.43 (s, 6H, 2CH$_3$); 3.93 (s, 3H, OCH$_3$); 7.29 (d, 2H, aromatic); 8.13 (d, 2H, aromatic). The absorptivity was 71.21 L/g.cm.

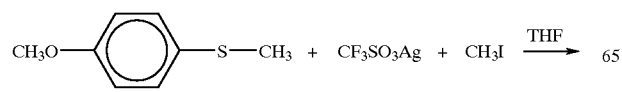

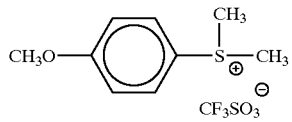

Example 2

4-Hydroxy-3,5-dimethyl phenyl dimethyl sulfonium chloride 61 g of dimethylphenol (0.5 mole), 39 g (0.5 mole) of dimethylsulfoxide (DMSO), and 400 ml of methanol were placed in a 1 liter round bottom flask equipped with a thermometer and a condenser. The mixture was cooled in a liquid nitrogen-isopropyl alcohol bath while hydrogen chloride gas was bubbled in at 10° C. for 6 hours. A precipitate was formed and a part of the methanol was removed by rotavap. The crystals were filtered and washed with ether several times. The solid product gave the following analytical results $^1$H NMR(Acetone-d6), 2.34 (s, 6H, 2CH$_3$); 3.23 (s, 6H, 2CH$_3$); 7.80 (s, 2H, aromatic).

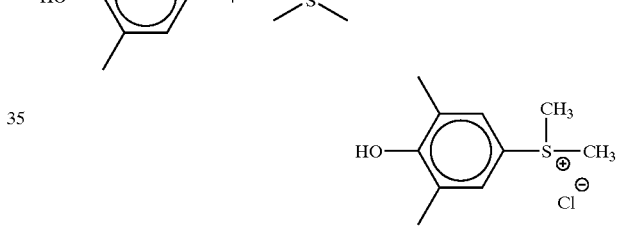

Example 3

4-Hydroxy-3,5-dimethyl phenyl dimethyl sulfonium triflate 2.185 g of 4-Hydroxy-3,5-dimethyl phenyl dimethyl sulfonium chloride were placed in a flask and 10 g of water were added, followed by 2.56 g of silver trifluoro methane sulfonate in acetone. A precipitate of AgCl formed immediately. The mixture was stirred for 30 minutes and the precipitate was filtered off. The solution was extracted with dichloromethane, dried over sodium sulphate and filtered. The solution was drowned into ether and a precipitate formed which was filtered and dried in the vacuum dryer at less than 40° C. The solid product gave the following analytical results: $^1$H NMR(Acetone-d6), 2.40 (s, 6H, 2CH$_3$); 3.10 (s, 6H, 2CH$_3$); 7.65 (s, 2H, aromatic).

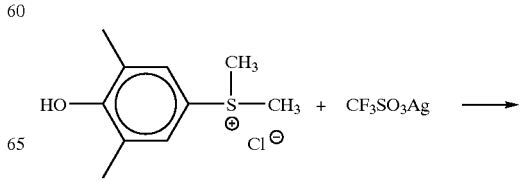

-continued

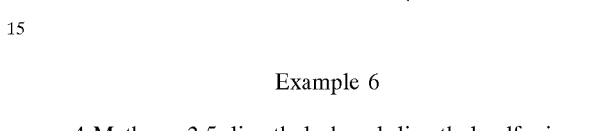

Example 4

4-Methoxy-3,5-dimethyl phenyl dimethyl sulfonium triflate

4-Hydroxy-3,5-dimethyl phenyl dimethyl sulfonium chloride (10.0 g, 0.054 mole) was placed in a 250 ml round bottom flask with a stirrer, a condenser and a thermowatch. Deionized water (100 ml) and 3.4 g of NaOH (50%) were added. Dimethyl sulphate (6.8 g, 0.054 mole) was added with a syringe. The mixture was stirred at room temperature for 20 minutes and then heated at 55° C. for 4 hours. After neutralization the reaction mix was added to acetone, and the salt precipitated out, which was filtered. The crude product in water was treated with silver trifluoromethane sulfonate and silver chloride was precipitated out. After filtering the salt, the solution was extracted with dichloromethane. The dichloromethane layer was washed with water, dried over sodium sulphate and drowned in ether. The precipitate was filtered and washed with ether. It was dried under vacuum. The solid product gave the following analytical results: $^1$H NMR(Acetone-d6), 2.40 (s, 6H, 2CH$_3$); 3.47 (s, 6H, 2CH$_3$); 3.85 (s, 3H, OCH$_3$); 7.89 (d, 2H, aromatic).

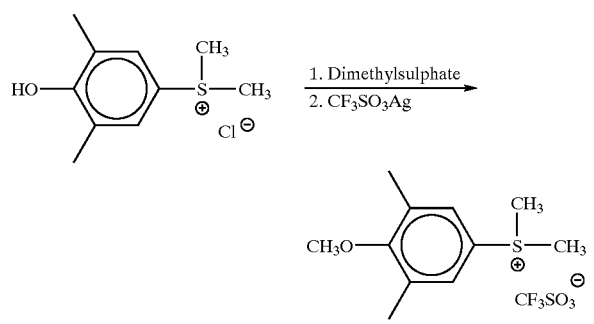

Example 5

4-Hydroxy-3,5-dimethyl phenyl dimethyl sulfonium nonaflate 2.185 g of 4-Hydroxy-3,5-dimethyl phenyl dimethyl sulfonium chloride, 100 g water, and 3.38 g of potassium perflouro butane sulfonate in acetone were added in a flask. A precipitate formed immediately. The mixture was stirred for 30 minutes, the solution was extracted with dichloromethane, dried over sodium sulphate and filtered. The solution was drowned into ether, a precipitate was formed, filtered and dried in the vacuum dryer at less than 40° C. The solid product gave the following analytical results: $^1$H NMR(Acetone-d6), 2.32 (s, 6H, 2CH$_3$); 3.4 (s, 6H, 2CH$_3$); 7.78 (s, 2H, aromatic). The absorptivity was 56.15 L/g.cm.

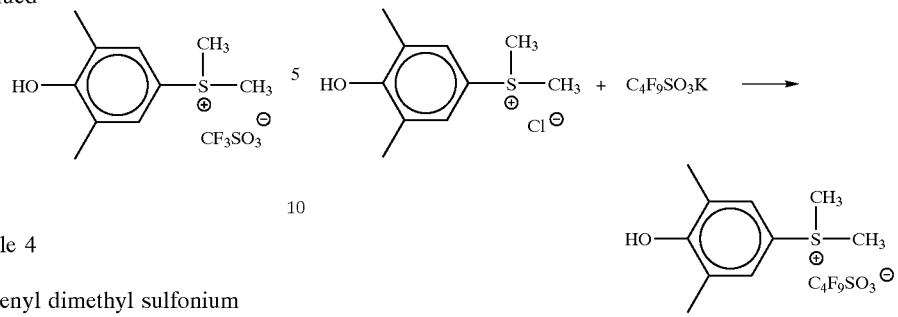

Example 6

4-Methoxy-3,5-dimethyl phenyl dimethyl sulfonium nonaflate 5.0 g (0.023 mole) of 4-Hydroxy-3,5-dimethyl phenyl dimethyl sulfonium chloride was placed in a flask equipped with a condenser, a thermometer, and a mechanical stirrer. 45 g of water and 0.92 g of sodium hydroxide were added, and an intense color appeared. Dimethyl sulphate (2.2 ml) was added at room temperature and the mixture was heated at 60° C. for 10 minutes. The solution changed to almost colorless. The heating was stopped after 15 minutes and the solution was cooled to room temperature. 7.78 g of potassium perfluoro butane sulfonate in acetone(50 ml) was added drop wise and mixed for 2 hours. It was extracted with dichoromethane and the dicholoromethane layer was washed with water, dried over sodium sulfate, and filtered. The solution was drowned into ether, and the precipitate formed was filtered and dried in the vacuum dryer at less than 40° C. The solid product gave the following analytical results: $^1$H NMR(Acetone-d6), 2.32 (s, 6H, 2CH$_3$); 3.4 (s, 6H, 2CH$_3$); 3.85 (s, 3H, OCH$_3$); 7.78 (s, 2H, aromatic. The absorptivity is 32.82 L/g.cm.

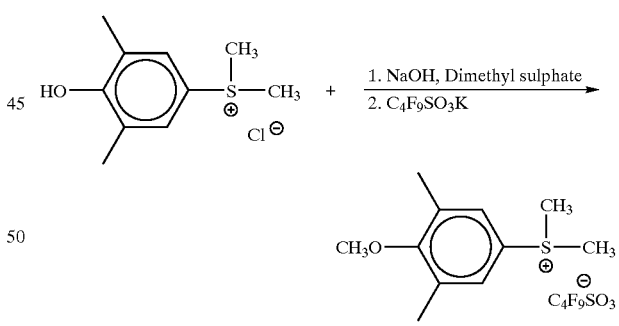

Example 7

4-Methoxy benzyl dimethyl sulfonium triflate

4-Methoxy benzyl mercaptan (25.0 g, 0.16 mole) was added to a 250 ml round bottom flask with an overhead stirrer, a condenser, and a thermometer. 50 g THF and 12.5 g of NaOH in water (50%) were added. Dimethyl sulphate (20.18 g, 0.16 mole, 15.2 ml) was added very slowly with a syringe. The mixture was stirred at room temperature for 20 minutes and then heated at 55° C. for 90 minutes. Silver trifluoromethane sulfonate (41 g, 0.16 mole) was added and the silver salt was precipitated out. After filtering the salt, the solution was diluted with acetone and water, extracted with ether, and the aqueous layer was extracted with dichloromethane. The dichloromethane layer was washed with water, dried over sodium sulphate and drowned in ether. A precipitate was formed, which was filtered and washed with ether. It was dried under vacuum. The solid product gave the following analytical results: 1H NMR(DMSO-d6), 2.75 (s, 6H, 2CH$_3$);3.80 (s, 3H, OCH$_3$); 4.61 (s, 2H, CH$_2$); 6.85–7.45 (m, 4H, aromatic).

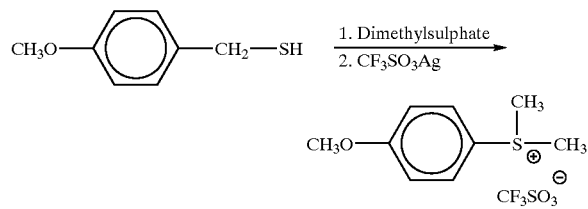

Example 8

4-t-Butyl acetoxy-3,5-dimethyl phenyl dimethyl sulfonium nonaflate 5.0 g of 4-Hydroxy-3,5-dimethyl phenyl dimethyl sulfonium chloride was taken in a flask, 100 g water, and 1.0 g of NaOH was added and cool to 0° C. and t-butylbromo acetate (4.46 g) was added, stirred for two hour at room temperature. Then 8.0 g of potassium perfluorobutane sulfonate in acetone were added. The mixture was stirred for 30 minutes; the solution was extracted with chloroform, and the chloroform layer was washed with water, dried over sodium sulphate and filtered. The solution was drowned into ether; a precipitate was formed, filtered and dried in the vacuum dryer at less than 40° C. The solid product gave the following analytical results: $^1$H NMR (DMSO-d6), 1.48(s, 9H, 3 CH$_3$),2.35 (s, 6H, 2CH$_3$); 3.3 (s, 6H, 2CH$_3$); 7.80 (s, 2H, aromatic), mp 120° C.

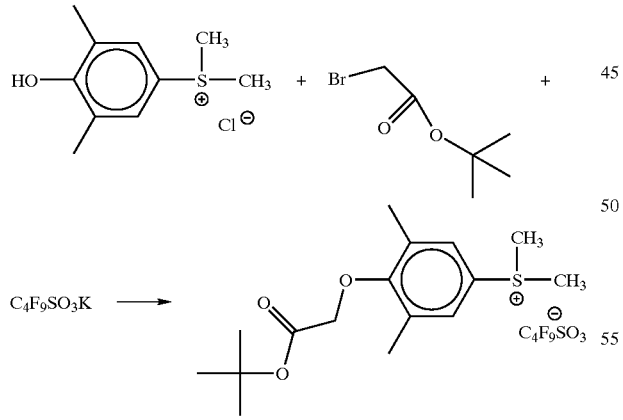

Example 9

4-(2-methyl-2-adamantyl acetoxy)-3,5-dimethyl phenyl dimethyl sulfonium nonaflate 6.39 g of 4-Hydroxy-3,5-dimethyl phenyl dimethyl sulfonium nonaflate was dissolved in 40 g acetone in a flask.

1.18 g of potassium carbonate was added and 2-methyl-2-adamantyl bromo acetate (3.57 g) was added, stirred overnight at room temperature. A white precipitate of KBr appeared. The reaction mixture was filtered and the precipitate was washed with acetone. The filtrate was concentrated under vacuum and drowned into ether; a precipitate was formed, filtered and dried in the vacuum dryer at less than 40° C. The solid product gave the following analytical results: $^1$H NMR (DMSO-d6), 1.19 (s, 3H, methyl), 1.5–2 (m, adamantly), 2.35 (s, 6H, 2CH$_3$); 3.3 (s, 6H, 2CH$_3$); 4.62(s, 2H, CH2) 7.88 (s, 2H, aromatic), mp 141° C.

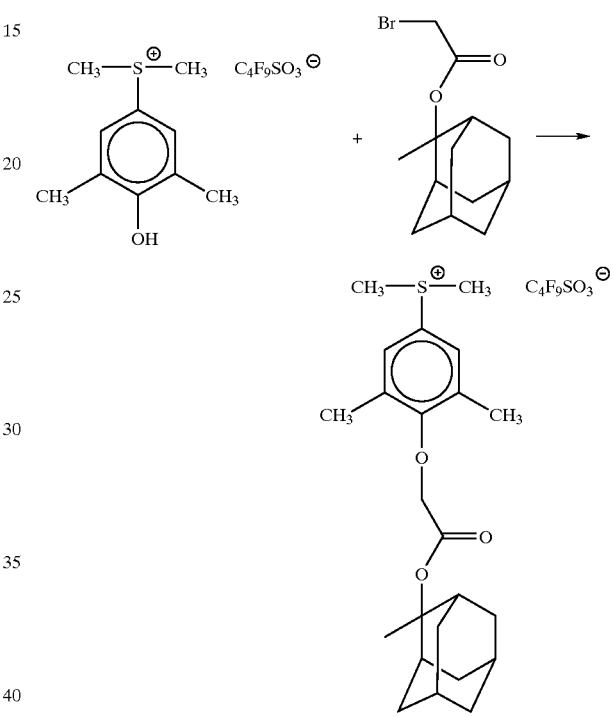

Example 10

4-hydroxy-3,5-dimethyl phenyl dimethyl sulfonium bis-perfluoromethane sulfonimide 3.60 g of 4-Hydroxy-3,5-dimethyl phenyl dimethyl sulfonium chloride in 150 g water was taken in a flask, and bis-perfluoromethane sulfonimide acid 8.15 g (50% in water) was added. A precipitate was formed. It was filtered and dissolved in chloroform and reprecipitated from ether (m.p. 84° C.). The solid product gave the following analytical results: $^1$H NMR (Acetone-d6), 2.32 (s, 6H, 2 CH$_3$); 3.2 (s, 6H, 2CH$_3$); 7.7 (s, 2H, aromatic); 9.6 (1H, OH).

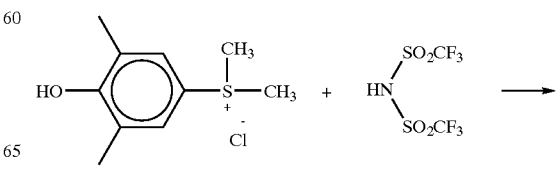

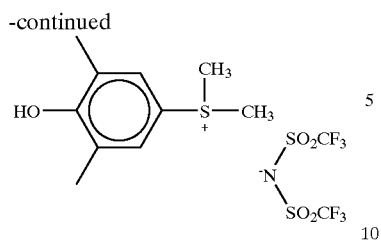

Example 11

4-hydroxy-3,5-dimethyl phenyl dimethyl sulfonium bis-perfluoroethane sulfonimide 3.24 g of 4-Hydroxy-3,5-dimethyl phenyl dimethyl sulfonium chloride in 150 g water was taken in a flask, and bis-perfluoroethane sulfonimide lithium salt 5.74 g was added. A precipitate was formed. It was filtered and dissolved in chloroform and reprecipitated from ether (m.p. 84° C.). The solid product gave the following analytical results: $^1$H NMR (Acetone-d6), 2.32 (s, 6H, 2 CH$_3$); 3.2 (s, 6H, 2CH$_3$); 7.70 (s, 2H, aromatic); 9.6 (1H, OH).

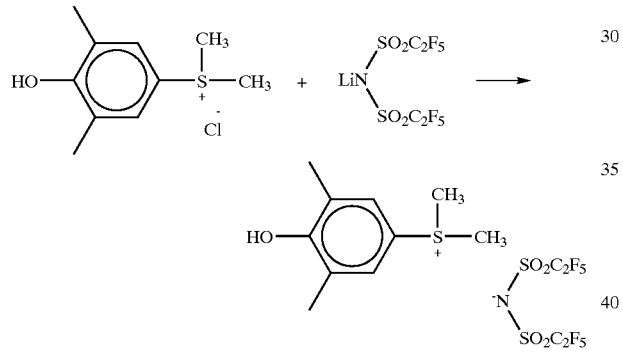

Example 12

4-hydroxy-3,5-dimethyl phenyl dimethyl sulfonium bis-perfluorobutane sulfonimide 3.0 g of 4-Hydroxy-3,5-dimethyl phenyl dimethyl sulfonium chloride in 50 g water was taken in a flask, and bis-perfluorobutane sulfonimide acid 13.295 g (50% in water) was added. A precipitate was formed. It was filtered and dissolved in chloroform and reprecipitated from ether (m.p. 84° C.). The solid product gave the following analytical results: $^1$H NMR (Acetone-d6), 2.32 (s, 6H, 2 CH$_3$); 3.2 (s, 6H, 2CH$_3$); 7.70 (s, 2H, aromatic); 9.6 (1H, OH).

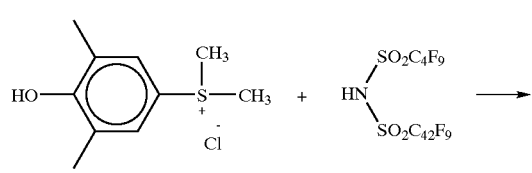

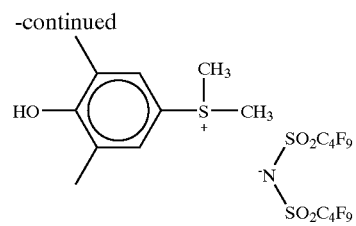

Example 13

4-hydroxy-3,5-dimethyl phenyl dimethyl sulfonium tris-perfluoromethane sulfonmethide 3.48 g of 4-Hydroxy-3,5-dimethyl phenyl dimethyl sulfonium chloride in 50 g water was taken in a flask, and tris-perfluoromethane sulfonmethide acid 10.936 g (60% in water) was added. A precipitate was formed. It was filtered and dissolved in chloroform and reprecipitated from ether (m.p. 90° C.). The solid product gave the following analytical results: $^1$H NMR (Acetone-d6), 2.32 (s, 6H, 2 CH$_3$); 3.2 (s, 6H, 2CH$_3$); 7.70 (s, 2H, aromatic); 9.6 (1H, OH).

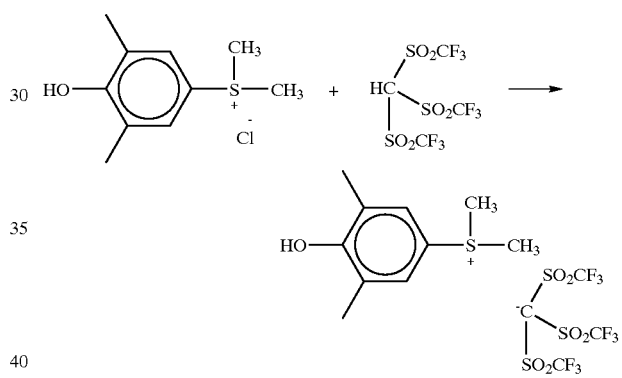

Example 14

4-hydroxy-3,5-dimethylphenyldimethylsulphnium pentafluorobenzene-sulfonate 7.08 g of 4-Hydroxy-3,5-dimethylphenyldimethylsulpfonium chloride was placed into a 250 ml round bottom flask and 100 ml of water was added. Then, 10.23 g of barium pentafluorobenzene-sulfonate in 16 ml acetone was added with stirring. The resulting mixture was mixed over night at room temperature. The reaction mixture was extracted with dichloromethane. The dichloromethane layer was washed with DI water, dried over sodium sulphate, filtered and the solvent was evaporated by rotary vacuum evaporator. Yield 6.97 g.

Example 15

Poly(t-butyl norbornene carboxylate-co-mevaloniclactone methacrylate-co-2-methyladamantyl methacrylate-co-maleic anhydride)

A hybrid copolymer was synthesized by reacting 126.45 g of t-butyl norbornene carboxylate (BNC), 129.2 g of mevaloniclactone methacrylate (MLMA) and 152.73 g of 2-methyladamantyl methacrylate (MAdMA) and 191.78 g of maleic anhydride (MA) in presence of 5 weight % of AIBN in tetrahydrofuran (THF) at 50% solid. The reaction was carried out for 8 hours and the polymer was isolated from diethyl ether twice(1/10 v/v ratio). The weight average molecular weight (Mw) as measured on a Gel Permeation Chromatograph (GPC) using polystyrene standards and THF solvent, was 5780.

Example 16

Poly(2-methyladamantyl methacrylate-co-mevaloniclactone methacrylate)

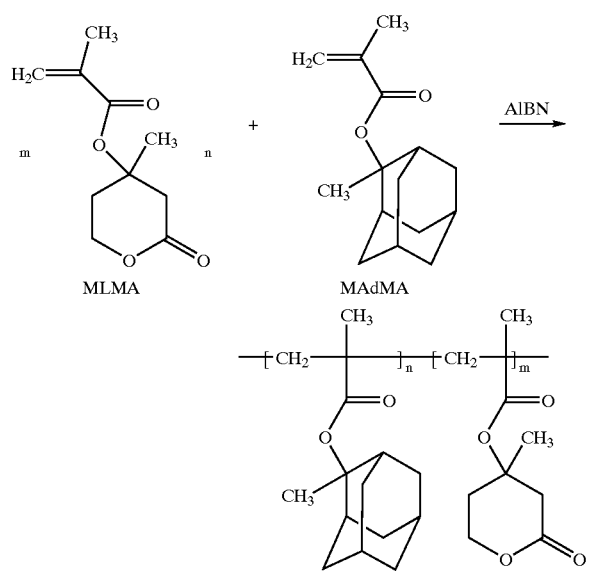

Polymerization was carried out using a feed of 1:1 molar ratio of MAdMA and MLMA in tetrahydrofuran (THF) (25% solids) using AIBN initiator (10 weight % with respect to monomers) at 70° C. under nitrogen atmosphere. The reaction mixture was stirred at 70° C. for 5 hours. The polymer solution was poured into methanol after the reaction was finished. The white powder was filtered, dissolved in THF (30% solids) again and re-precipitated, filtered and dried under vacuum until constant weight was obtained. The polymerization yield was about 65%. The Mw and number average molecular weight (Mn) as measured on a GPC using polystyrene standards and THF solvent were 14000 and 8000, respectively.

Example 17

2.5527 g of poly(2-methyladamantyl methacrylate-co-2-mevalonic lactone methacrylate) as in Example 15, 0.0431 g (30 µmol/g) of triphenylsulfonium nonafluorobutane sulfonate, 0.0244 g (30 µmol/g) of 4-methoxy-3,5-dimethyl phenyl sulfonium nonaflate, 0.4831 g of 1 weight % ethyl lactate solution of diethanolamine and 0.03 g of 10 weight % ethyl lactate solution of a surfactant (fluoroaliphatic polymeric ester, supplied by 3M Corporation, St. Paul Minn.) were dissolved in 21.887 g of ethyl lactate to give a photoresist solution and it was filtered through a 0.2 µm PTFE filter. The photoresist was processed in a similar manner to Comparative Example 1 (set forth below). The photoresist had n and k values of 1.7120 and 0.017 respectively. The photoresist had a photosensitivity of 34 mJ/cm² and a linear resolution of 0.12 µm. The line edge roughness (3σ) as measured on a KLA8100 CD SEM for 130 nm L/S was 5.5 nm, which was a 54% improvement in line edge roughness over Comparative Example 1.

Example 18

2.5506 g of the polymer as in Example 15, 0.0430 g of triphenylsulfonium nonafluorobutanesulfonate, 0.0244 g of 4-methoxy-3,5-dimethyl phenyl sulfonium nonaflate, 0.7036 g of 1% PGMEA solution of 3-trimethyl-6-azabicyclo[3.2.1]octane, and 0.03 g of 10 weight % propylene glycol monomethyl ether acetate (PGMEA) solution of a surfactant (fluoroaliphatic polymeric ester, supplied by 3M corporation, Minnesota) were dissolved in 21.65 g of PGMEA. The solution was filtered using a 0.2 µm PTFE filter and processed in a similar manner to that described in Comparative Example 2 (set forth below). The photoresist had n and k values of 1.7144 and 0.023088 respectively. The photoresist had a sensitivity of 22 mJ/cm² and a linear resolution of 0.09 µm. The line edge roughness (3σ) as measured on a KLA8100 CD SEM for 130 nm L/S was 6.2 nm, which was a 44% improvement in line edge roughness over Comparative Example 2.

Example 19

2.7401 g of the polymer as in Example 15, 0.0694 g of triphenylsulfonium nonafluorobutanesulfonate, 0.0523 g of 4-methoxy-3,5-dimethyl phenyl sulfonium nonaflate, 1.3227 g of 1% PGMEA solution of 3-trimethyl-6-azabicyclo[3.2.1]octane, and 0.03 g of 10 weight % propylene glycol monomethyl ether acetate (PGMEA) solution of a surfactant (fluoroaliphatic polymeric ester, (FC-430) supplied by 3M corporation, Minnesota) were dissolved in 20.78 g of PGMEA. The solution was filtered using 0.2 µm PTFE filter and processed in a similar manner to that described in Comparative Example 2 (set forth below). The photoresist had a photosensitivity of 21 mJ/cm² and a linear resolution of 0.09 µm. The line edge roughness (3σ) as measured on a KLA8100 CD SEM for 130 nm L/S was 6.2 nm, which was a 46% improvement in line edge roughness over Comparative Example 2.

Example 20

2.5507 g of poly(2-methyladamantyl methacrylate-co-2-mevalonic lactone methacrylate) as in Example 16, 0.0431 g of triphenylsulfonium nonafluorobutane sulfonate, 0.0288 g of cyclohexyl, 2-oxocyclohexyl, methyl sulfonium trifluoromethane sulfonate (absorptivity 3.32 L/g.cm), 0.2414 g of 1 weight % ethyl lactate solution of diethanolamine and 0.03 g of 10 weight % ethyl lactate solution of a surfactant (fluoroaliphatic polymeric ester, supplied by 3M Corporation, St. Paul Minn.) were dissolved in 22.1 g of ethyl lactate to give a photoresist solution and it was filtered through a 0.2 µm PTFE filter. The photoresist was processed in a similar manner to Comparative Example 1 (set forth below). The photoresist had a photosensitivity of 23 mJ/cm² and a linear resolution of 0.12 µm. The line edge roughness (3σ) as measured on a KLA8100 CD SEM for 130 nm L/S was 5.5 nm, which was a 54% improvement in line edge roughness over Comparative Example 1.

Example 21

2.5548 g of poly(2-methyladamantyl methacrylate-co-2-mevalonic lactone methacrylate), 0.0431 g of triphenylsulfonium nonafluorobutane sulfonate, 0.0288 g of bis(phenylsulfonyl)diazomethane (absorptivity 169.49 L/g.cm) from Midori Kagaku Company, 0.2417 g of 1 weight % ethyl lactate solution of diethanolamine and 0.03 g of 10 weight % ethyl lactate solution of a surfactant (fluoroaliphatic polymeric ester, supplied by 3M Corporation, St. Paul Minn.) were dissolved in 22.1 g of ethyl lactate to give a photoresist solution and it was filtered through a 0.2 µm PTFE filter. The photoresist was processed in a similar manner to Comparative Example 1 (set forth below). The photoresist had a photosensitivity of 24 mJ/cm$^2$ and a linear resolution of 0.13 µm. The line edge roughness (3σ) as measured on a KLA8100 CD SEM for 130 nm L/S was 7.0 nm, which was a 41% improvement in line edge roughness over Comparative Example 1.

Example 22

2.5496 g of poly(2-methyladamantyl methacrylate-co-2-mevalonic lactone methacrylate), 0.0430 g of triphenylsulfonium nonafluorobutane sulfonate, 0.0288 g of [bis(p-chlorophenylsulfonyl)diazomethane] (absorptivity 146.49 L/g.cm) from Midori Kagaku Company, 0.2413 g of 1 weight % ethyl lactate solution of diethanolamine and 0.03 g of 10 weight % ethyl lactate solution of a surfactant (fluoroaliphatic polymeric ester, supplied by 3M Corporation, St. Paul Minn.) were dissolved in 22.1 g of ethyl lactate to give a photoresist solution and it was filtered through a 0.2 µm PTFE filter. The photoresist was processed in a similar manner to Comparative Example 1. The formulation had a sensitivity of 23 mJ/cm$^2$ and a linear resolution of 0.12 µm. The line edge roughness (3σ) as measured on a KLA8100 CD SEM for 130 nm L/S was 7.5 nm, which was a 38% improvement in line edge roughness over Comparative Example 1.

Example 23

2.5556 g of poly(2-methyladamantyl methacrylate-co-2-mevalonic lactone methacrylate), 0.0431 g of triphenylsulfonium nonafluorobutane sulfonate, 0.0239 g of [5-Norbornene-2,3-trifluoromethanesulfonimide] (absorptivity 71.42 L/g.cm) from Midori Kagaku Company, 0.2418 g of 1 weight % ethyl lactate solution of diethanolamine and 0.03 g of 10 weight % ethyl lactate solution of a surfactant (fluoroaliphatic polymeric ester, supplied by 3M Corporation, St. Paul Minn.) were dissolved in 22.1 g of ethyl lactate to give a photoresist solution and it was filtered through a 0.2 µm PTFE filter. The resist was processed similar to Comparative Example 1 (set forth below). The formulation had a sensitivity of 21 mJ/cm$^2$ and a linear resolution of 0.13 µm. The line edge roughness (3σ) as measured on a KLA8100 CD SEM for 130 nm L/S was 7.8 nm, which was a 35% improvement in line edge roughness over Comparative Example 1.

Example 24

2.5512 g of poly(2-methyladamantyl methacrylate-co-2-mevalonic lactone methacrylate), 0.0430 g of triphenylsulfonium nonafluorobutane sulfonate, 0.0283 g of [4,5-dihydroxy-1-napthalene dimethylsulfonium trifluoromethane sulfonate] (absorptivity 50.62 L/g.cm) from Midori Kagaku Company, 0.2414 g of 1 weight % ethyl lactate solution of diethanolamine and 0.03 g of 10 weight % ethyl lactate solution of a surfactant (fluoroaliphatic polymeric ester, supplied by 3M Corporation, St. Paul Minn.) were dissolved in 22.1 g of ethyl lactate to give a photoresist solution and it was filtered through a 0.2 µm PTFE filter. The photoresist was processed in a similar manner as Comparative Example 1. The photoresist had a photosensitivity of 21 mJ/cm$^2$ and a linear resolution of 0.13 µm. The line edge roughness (3σ) as measured on a KLA8100 CD SEM for 130 nm L/S was 8.0 nm, which was a 33% improvement in line edge roughness over Comparative Example 1.

Example 25

2.5512 g of poly(2-methyladamantyl methacrylate-co-2-mevalonic lactone methacrylate), 0.0430 g of triphenylsulfonium nonafluorobutane sulfonate, 0.0283 g of 4,6-dihydroxy-1-napthalene dimethylsulfonium trifluoromethane sulfonate (absorptivity 60.34 L/g.cm) from Midori Kagaku Company, 0.2414 g of 1 weight % ethyl lactate solution of diethanolamine and 0.03 g of 10 weight % ethyl lactate solution of a surfactant (fluoroaliphatic polymeric ester, supplied by 3M Corporation, St. Paul Minn.) were dissolved in 22.1 g of ethyl lactate to give a photoresist solution and it was filtered through a 0.2 µm PTFE filter. The photoresist was processed in a similar manner to Comparative Example 1. The photoresist had a photosensitivity of 0.22 mJ/cm$^2$ and a linear resolution of 0.13. The line edge roughness (3σ) as measured on a KLA8100 CD SEM for 130 nm L/S was 7.5 nm, which was a 38% improvement in line edge roughness over Comparative Example 1.

Example 26

2.5527 g of poly(BNC/MA/MAdMA/GBLMA; 1/1/1/1; made by reacting equal molar amounts of each monomer in the presence of AIBN (2.5 g in THF (50 g) at 50% solid) for a reaction time of about 8 hours at about 67° C., isolating the polymer from diethyl ether twice (1/10 v/v ratio)), 0.0431 g (30 µmol/g) of triphenylsulfonium nonafluorobutane sulfonate, 0.0244 g (30 µmol/g) of 4-t-Butyl acetoxy-3,5-dimethyl phenyl dimethyl sulfonium nonaflate, 0.4831 g of 1 wt % PGMEA solution of N-(1-adamantyl) acetamide, and 0.03 g of 10 wt % PGMEA solution of a surfactant (fluoroaliphatic polymeric ester, supplied by 3M Corporation, St. Paul Minn.) were dissolved in 21.887 g of PGMEA to give a photoresist solution and it was filtered through a 0.2 µm PTFE filter.

Example 27

A silicon substrate coated with a bottom antireflective coating (B.A.R.C.) was prepared by spin coating the bottom anti-reflective coating solution (AZ® EXP ArF-1 B.A.R.C. available from Clariant Corporation, Somerville, N.J.) onto the silicon substrate and baking at 175° C. for 60 sec. The B.A.R.C film thickness was 39 nm. The photoresist solution of Example 26 was then coated on the B.A.R.C coated silicon substrate. The spin speed was adjusted such that the photoresist film thickness was 330 nm. The photoresist film was baked at 115° C. for 90 sec. The substrate was then exposed in a 193 nm ISI mini stepper (numerical aperture of 0.6 and coherence of 0.7) using a chrome on quartz binary mask. After exposure, the wafer was post-exposure baked at 130° C. for 90 sec. The imaged photoresist was then developed using a 2.38 weight % aqueous solution of tetramethyl ammonium hydroxide for 30 sec. The line and space patterns were then observed on a scanning electron microscope. The photoresist had a photosensitivity of 22 mJ/cm$^2$ and a linear resolution of 0.11 μm. The line edge roughness (3σ) as measured on a KLA8100 CD SEM for 130 nm L/S (1:1 pitch at best focus) was 12 nm.

Example 28

2.5527 g of poly(BNC/MA/MAdMA/GBLMA; 1/1/1/1; made by reacting equal molar amounts of each monomer in the presence of AIBN (2.5 g in THF (50 g) at 50% solid) for a reaction time of about 8 hours at about 67° C., isolating the polymer from diethyl ether twice (1/10 v/v ratio)), 0.0431 g (30 μmol/g) of triphenylsulfonium nonafluorobutane sulfonate, 0.0244 g (30 μmol/g) of 4-t-Butyl acetoxy-3,5-dimethyl phenyl dimethyl sulfonium nonaflate, 0.4831 g of 1 wt % PGMEA solution of N-(1-Adamantyl) acetamide, and 0.03 g of 10 wt % PGMEA solution of a surfactant (fluoroaliphatic polymeric ester, supplied by 3M Corporation, St. Paul Minn.) were dissolved in 21.887 g of PGMEA to give a photoresist solution and it was filtered through a 0.2 μm PTFE filter.

Example 29

A silicon substrate coated with a bottom antireflective coating (B.A.R.C.) was prepared by spin coating the bottom anti-reflective coating solution (AZ® EXP ArF-1 B.A.R.C. available from Clariant Corporation, Somerville, N.J.) onto the silicon substrate and baking at 175° C. for 60 sec. The B.A.R.C film thickness was 39 nm. The photoresist solution of Example 28 was then coated on the B.A.R.C coated silicon substrate. The spin speed was adjusted such that the photoresist film thickness was 330 nm. The photoresist film was baked at 115° C. for 90 sec. The substrate was then exposed in a 193 nm ISI mini stepper (numerical aperture of 0.6 and coherence of 0.7) using a chrome on quartz binary mask. After exposure, the wafer was post-exposure baked at 130° C. for 90 sec. The imaged photoresist was then developed using a 2.38 weight % aqueous solution of tetramethyl ammonium hydroxide for 30 sec. The line and space patterns were then observed on a scanning electron microscope. The photoresist had a photosensitivity of 22 mJ/cm$^2$ and a linear resolution of 0.11 μm. The line edge roughness (3σ) as measured on a KLA8100 CD SEM for 130 nm L/S (1:1 pitch at best focus) was 12 nm.

Comparative Example 1

1.5222 g of poly(2-methyladamantyl methacrylate-co-2-mevalonic lactone methacrylate) of Example 16, 0.0514 g (60 μmol/g) of triphenylsulfonium nonafluorobutanesulfonate (absorptivity 117.74 L/g.cm), 0.1444 g of 1 weight % ethyl lactate solution of diethanolamine and 0.018 g of 110 ppm ethyl lactate solution of a surfactant (FC-430, fluoroaliphatic polymeric ester, supplied by 3M Corporation, St. Paul Minn.) were dissolved in 13.26 g of ethyl lactate to give a photoresist solution and it was filtered through a 0.2 μm PTFE filter. The n and k values at 193 nm for this photoresist film were 1.7287 and 0.02432, respectively. Separately, a silicon substrate coated with a bottom antireflective coating (B.A.R.C.) was prepared by spin coating the bottom anti-reflective coating solution (AZ® EXP ArF-1 B.A.R.C. available from Clariant Corporation, Somerville, N.J.) onto the silicon substrate and baking at 175° C. for 60 sec. The B.A.R.C film thickness was 39 nm. The photoresist solution was then coated on the B.A.R.C coated silicon substrate. The spin speed was adjusted such that the photoresist film thickness was 330 nm. The photoresist film was baked at 115° C. for 60 sec. The substrate was then exposed in a 193 nm ISI mini stepper (numerical aperture of 0.6 and coherence of 0.7) using a chrome on quartz binary mask. After exposure, the wafer was post-exposure baked at 110° C. for 60 sec. The imaged photoresist was then developed using a 2.38 weight % aqueous solution of tetramethyl ammonium hydroxide for 60 sec. The line and space patterns were then observed on a scanning electron microscope. The photoresist had a photosensitivity of 20 mJ/cm$^2$ and a linear resolution of 0.12 μm. The line edge roughness (3σ) as measured on a KLA8100 CD SEM for 130 nm L/S (1:1 pitch at best focus) was 12 nm.

Comparative Example 2

26.05 g of polymer of Example 15, 0.820 g (56 μmol/g) of triphenylsulfonium nonafluorobutanesulfonate (absorptivity 117.74 L/g.cm), 13.4g of 1 weight % propylene glycol monomethyl ether acetate (PGMEA) solution of 1,3,3-trimethyl-6-azabicyclo(3.2.1)octane and 0.24g of 10 weight % propylene glycol monomethyl ether acetate (PGMEA) solution of a surfactant (FC-430, fluoroaliphatic polymeric ester, supplied by 3M corporation, Minnesota) were dissolved in 159.5 g of PGMEA. The solution was filtered using a 0.2 μm PTFE filter and processed in a similar manner to that described in Comparative Example 1 except the photoresist film was baked at 110° C. for 90 sec, post-exposure baked at 130° C. for 90 sec and development was carried out for 30 sec. The n and k values at 193 nm were 1.7108 and 0.028, respectively. The photoresist had a photosensitivity of 17 mJ/cm$^2$ and a linear resolution of 0.09 μm. The line edge roughness (3σ) as measured on a KLA8100 CD SEM for 130 nm L/S was 11 nm (130 nm, 1:2 pitch at best focus).

Comparative Example 3

43.92 g of the polymer as in Example 15, 0.11234 g of 4-methoxy-3,5-dimethyl phenyl sulfonium nonaflate (Example 6), 1.622 g of 1% PGMEA solution of 3-trimethyl-6-azabicyclo[3.2.1]octane, and 0.036 g of 10 weight % propylene glycol monomethyl ether acetate (PGMEA) solution of a surfactant (fluoroaliphatic polymeric ester, supplied by 3M corporation, Minnesota) were dissolved in 24.30 g of PGMEA. The solution was filtered using a 0.2 μm PTFE filter and processed in a similar manner to that described in Comparative Example 2. The n and k values at 193 nm were 1.7158 and 0.01670 respectively. The photoresist had a sensitivity of 80 mJ/cm$^2$ and a linear resolution of 0.09 μm. The line edge roughness (3σ) as measured on a KLA8100 CD SEM for 130 nm L/S was 5 nm (130 nm, 1:2 pitch at best focus).

Comparative Example 4

1.544 g of poly(2-methyladamantyl methacrylate-co-2-mevalonic lactone methacrylate) as in Example 15, 0.0295 g (60 μmol/g) of 4-methoxy-3,5-dimethyl phenyl sulfonium nonaflate (Example 6), 0.1461 g of 1 weight % ethyl lactate solution of diethanolamine and 0.018 g of 120 ppm ethyl lactate solution of a surfactant (FC-430, fluoroaliphatic polymeric ester, supplied by 3M Corporation, St. Paul Minn.) were dissolved in 13.26 g of ethyl lactate to give a photoresist solution and it was filtered through a 0.2 μm PTFE filter. The photoresist was processed in a similar way to Comparative Example 1. The n and k values at 193 nm were 1.7294 and 0.012716, respectively. The photoresist had a photosensitivity of 63 mJ/cm² and a linear resolution of 0.12 μm. The line edge roughness (3σ) as measured on a KLA8100 CD SEM for 130 nm L/S (1:1 pitch, best focus) was 5 nm.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A photoresist composition comprising;
   a) a polymer containing an acid labile group; and,
   b) a mixture of photoactive compounds, where the mixture comprises a lower absorbing compound selected from structure (1) and (2), and a higher absorbing compound selected from structure (4) and (5),

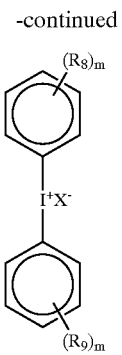

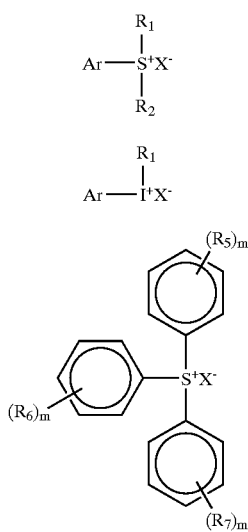

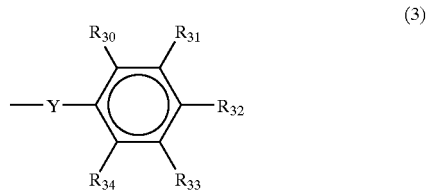

where $R_1$ and $R_2$ are independently $C_{1-20}$ straight or branched alkyl chain optionally containing one or more O atoms, $C_{5-50}$ aralkyl or $C_{5-50}$ monocyclic, bicyclic, or tricylic alkyl group; each of $R_5$, $R_6$, $R_7$, $R_8$, and $R_9$ are independently hydrogen, hydroxyl, $C_{1-20}$ straight or branched alkyl chain optionally containing one or more O atoms, $C_{5-50}$ aralkyl or $C_{5-50}$ monocyclic, bicyclic, or tricylic alkyl group; m=1–5; $X^-$ is an anion; and Ar is selected from naphthyl, anthryl, and structure (3), where each of $R_{30}$, $R_{31}$, $R_{32}$, $R_{33}$, and $R_{34}$ are independently selected from hydrogen, hydroxyl, $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, $C_{5-50}$ aryl group, $C_{5-50}$ arylcarbonylmethylene group, phenyl group, naphthyl group, anthryl group, peryl group, pyryl group, thienyl group, $C_{5-50}$ aralkyl group, —O—$C_{5-50}$ monocyclic, bicyclic, or tricylic alkyl group, —O—$C_{5-50}$ aryl group, —O—$C_{5-50}$ aralkyl group, —O—$C_{5-50}$ arylcarbonylmethylene group, or —O—C(=O)—O—$R_{18}$ where $R_{18}$ is $C_{1-20}$ straight or branched alkyl chain optionally containing one or more O atoms, $C_{5-50}$ monocyclic, bicyclic, or tricylic alkyl group, $C_{5-50}$ aryl, or $C_{5-50}$ aralkyl group;

the $C_{1-20}$ straight or branched alkyl chain optionally containing one or more O atoms, $C_{1-20}$ straight or branched alkoxy chain, $C_{5-50}$ monocyclic, bicyclic, or tricylic alkyl group, $C_{5-50}$ cyclic alkylcarbonyl group, phenyl group, naphthyl group, anthryl group, peryl group, pyryl group, thienyl group, $C_{5-50}$ aralkyl group, $C_{5-50}$ aryl group, or $C_{5-50}$ arylcarbonylmethylene group being unsubstituted or substituted by one or more groups selected from the group consisting of halogen, $C_{1-10}$ alkyl, $C_{3-20}$ cyclic alkyl, $C_{1-10}$ alkoxy, $C_{3-20}$ cyclic alkoxy, di $C_{1-10}$ alkylamino, dicyclic di $C_{1-10}$ alkylamino, hydroxyl, cyano, nitro, oxo, aryl, aralkyl, oxygen, aryloxy, arylthio, and groups of formulae (II) to (VI):

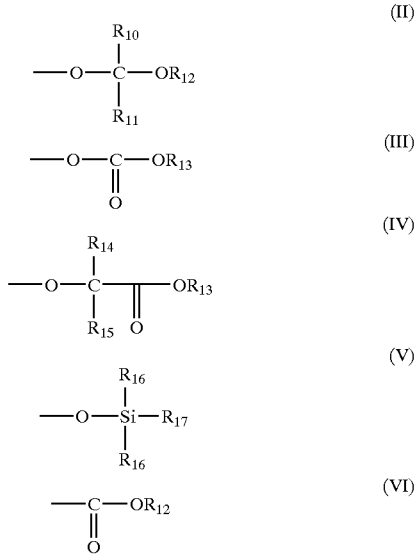

wherein R$_{10}$ and R$_{11}$ each independently represent a hydrogen atom, a C$_{1-20}$ straight or branched alkyl chain optionally containing one or more O atoms, or a C$_{5-50}$ monocyclic, bicyclic, or tricylic alkyl group, or R$_{10}$ and R$_{11}$ together can represent an alkylene group to form a five- or six-membered ring, R$_{12}$ represents a C$_{1-20}$ straight or branched alkyl chain optionally containing one or more O atoms, a C$_{5-50}$ monocyclic, bicyclic, or tricylic alkyl group, or a C$_{5-50}$ aralkyl group, or R$_{10}$ and R$_{12}$ together represent an alkylene group which forms a five- or six-membered ring together with the interposing —C—O—group, the carbon atom in the ring being optionally substituted by an oxygen atom, R$_{13}$ represents a C$_{1-20}$ straight or branched alkyl chain optionally containing one or more O atoms or a C$_{5-50}$ monocyclic, bicyclic, or tricylic alkyl group, R$_{14}$ and R$_{15}$ each independently represent a hydrogen atom, a C$_{1-20}$ straight or branched alkyl chain optionally containing one or more O atoms or a C$_{5-50}$ monocyclic, bicyclic, or tricylic alkyl group, R$_{16}$ represents a C$_{1-20}$ straight or branched alkyl chain optionally containing one or more O atoms, a C$_{5-50}$ monocyclic, bicyclic, or tricylic alkyl group, a C$_{5-50}$ aryl group, or a C$_{5-50}$ aralkyl group, and R$_{17}$ represents C$_{1-20}$ straight or branched alkyl chain optionally containing one or more O atoms, a C$_{5-50}$ monocyclic, bicyclic, or tricylic alkyl group, a C$_{5-50}$ aryl group, a C$_{5-50}$ aralkyl group, the group —Si(R$_{16}$)$_2$R$_{17}$, or the group —O—Si(R$_{16}$)$_2$R$_{17}$; and Y is a single bond or (C$_1$–C$_6$)alkyl.

2. The composition according to claim 1, where for the compound of structure (1) Ar is structure (3).

3. The composition according to claim 2, wherein R$_{32}$ is selected from hydrogen, —O—C$_{1-20}$ straight or branched alkyl chain optionally containing one or more O atoms, —O—C$_{5-50}$ monocyclic, bicyclic or tricylic alkyl group, or —O—C(=O)—O—R$_{18}$.

4. The composition of claim 3 wherein R$_{18}$ is C$_{1-20}$ straight or branched alkyl chain optionally containing one or more O atoms, or C$_{5-50}$ monocyclic, bicyclic, or tricylic alkyl group, the C$_{5-50}$ monocyclic, bicyclic, or tricylic alkyl group being unsubstituted or substituted by one or more groups selected from the group consisting of halogen, C$_{1-10}$ alkyl, C$_{3-20}$ cyclic alkyl, C$_{1-10}$ alkoxy, C$_{3-20}$ cyclic alkoxy, di C$_{1-10}$ alkylamino, dicyclic di C$_{1-10}$ alkylamino, hydroxyl, cyano, nitro, or aryl.

5. The composition according to claim 1, wherein the compound of structure (1) is selected from a 4-methoxyphenyl-dimethylsulfonium salt, 3,5-dimethyl-4-methoxyphenyl-dimethyl sulfonium salt, 3,5-dimethyl-4-hydroxyphenyl-dimethyl sulfonium salt, 4-hydroxyphenyl-dimethyl sulfonium salt, 3,5-dimethyl-4-hydroxyphenyl-dimethyl sulfonium salt, 4-t-butyl acetoxy-3,5-dimethyl phenyl dimethyl sulfonium salt, and 4-(2-methyl-2-adamantyl acetoxy)-3,5-dimethyl phenyl dimethyl sulfonium.

6. The composition according to claim 1, wherein the compound of structure (2) is selected from 4-methoxyphenyl-methyliodonium salt, 3,5-dimethyl-4-hydroxyphenyl-methyliodonium salt, 4-hydroxyphenyl-methyl iodonium salt and 3,5-dimethyl-4-methoxyphenyl-methyliodonium salt.

7. The composition according to claim 1, wherein the compound of structure (4) is selected from a triphenyl sulfonium salt and its derivatives.

8. The composition according to claim 1, wherein the compound of structure (5) is selected from a diphenyl iodonium salt and its derivatives.

9. The composition according to claim 1, wherein the polymer is nonaromatic.

10. The composition according to claim 1, wherein the molar ratio of the higher absorbing compound to the lower absorbing compound is from about 1:10 to about 10:1.

11. The composition according to claim 10, wherein the molar ratio of the higher absorbing compound to the lower absorbing compound is from about 1:5 to about 5:1.

12. The composition according to claim 11, wherein the molar ratio of the higher absorbing compound to the lower absorbing compound is from about 1:2 to about 2:1.

13. The composition according to claim 12, wherein the molar ratio of higher absorbing compound to the lower absorbing compound is about 1:1.

14. A compound selected from 4-(2-methyl-2-adamantyl acetoxy)-3,5-dimethyl phenyl dimethyl sulfonium nonaflate, 4-hydroxy-3,5-dimethyl phenyl dimethyl sulfonium bis-perfluoromethane sulfonamide, 4-hydroxy-3, 5-dimethyl phenyl dimethyl sulfonium bis-perfluoroethane sulfonamide, 4-hydroxy-3,5-dimethyl phenyl dimethyl sulfonium bis-perfluorobutane sulfonamide, 4-hydroxy-3,5-dimethyl phenyl dimethyl sulfonium tris-perfluoromethane sulfonmethide, and 4-hydroxy-3,5-dimethylphenyldimethylsulfonium pentafluorobenzene-sulfonate.

15. A process for imaging a photoresist comprising the steps of:
  a) coating a substrate with the photoresist composition of claim 1;
  b) baking the substrate to substantially remove the solvent;
  c) image-wise exposing the photoresist coating;
  d) postexposure baking the photoresist coating; and
  e) developing the photoresist coating with an aqueous alkaline solution.

16. The process of claim 15, wherein the image-wise exposure wavelength is below 200 nm.

17. The process according to claim 15, wherein the aqueous alkaline solution comprises tetramethylammonium hydroxide.

18. The process according to claim 15, wherein the aqueous alkaline solution further comprises a surfactant.

19. The process according to claim 15, wherein the substrate is selected from a microelectronic device and a liquid crystal display substrate.

* * * * *